(12) United States Patent
Kim et al.

(10) Patent No.: US 9,793,133 B2
(45) Date of Patent: Oct. 17, 2017

(54) METHODS OF FORMING SEMICONDUCTOR DEVICE INCLUDING CAPACITORS WITH MODIFIED SIDEWALLS AND RELATED DEVICES

(71) Applicant: Samsung Electronics Co., Ltd., Suwon-Si, Gyeonggi-do (KR)

(72) Inventors: Chan-Won Kim, Seoul (KR); Jung-Woo Seo, Hwaseong-si (KR); Kee-Hong Lee, Seongnam-si (KR); Kyoung-Ryul Yoon, Yongin-si (KR); Seong-Kyu Yun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 265 days.

(21) Appl. No.: 14/509,828

(22) Filed: Oct. 8, 2014

(65) Prior Publication Data

US 2015/0214289 A1 Jul. 30, 2015

(30) Foreign Application Priority Data

Jan. 28, 2014 (KR) ........................ 10-2014-0010769

(51) Int. Cl.
- *H01L 21/311* (2006.01)
- *H01L 27/108* (2006.01)
- *H01L 49/02* (2006.01)

(52) U.S. Cl.
CPC ...... *H01L 21/311* (2013.01); *H01L 27/10814* (2013.01); *H01L 27/10823* (2013.01); *H01L 27/10852* (2013.01); *H01L 28/90* (2013.01); *H01L 21/31116* (2013.01)

(58) Field of Classification Search
None
See application file for complete search history.

(56) References Cited

U.S. PATENT DOCUMENTS

| 6,143,672 | A | * | 11/2000 | Ngo | ...................... C23C 16/402 257/E21.278 |
| 6,215,187 | B1 | | 4/2001 | Ooto et al. | |
| 6,528,368 | B1 | * | 3/2003 | Park | .................. H01L 27/10855 257/E21.577 |
| 6,774,059 | B1 | * | 8/2004 | Chuang | ............... H01L 21/3185 148/217 |

(Continued)

FOREIGN PATENT DOCUMENTS

| JP | 2011-003598 A | 1/2011 |
| KR | 10-0532202 B1 | 11/2005 |
| KR | 10-2008-0098895 A | 11/2008 |

OTHER PUBLICATIONS

Kastenmeier et al., "Highly selective etching of silicon nitride over silicon and silicon oxide," 1999, J. Vac. Sci. Technol. A, 17(6), pp. 3179-3184.*

*Primary Examiner* — Duy T Nguyen
*Assistant Examiner* — Bo Bin Jang
(74) *Attorney, Agent, or Firm* — Ward and Smith, P.A.

(57) ABSTRACT

Methods of forming a semiconductor device can be provided by forming a first molding layer on a substrate and forming a first hole through the first molding layer. A second molding layer can be formed on the first molding layer so that the first hole is retained in the first molding layer and a second hole can be formed through the second molding layer to connect with the first hole. A capacitor electrode can be formed in the first and second holes.

15 Claims, 38 Drawing Sheets

(56) References Cited

U.S. PATENT DOCUMENTS

2008/0070375 A1\* 3/2008 Kim ................. H01L 27/10855
438/397
2008/0277760 A1\* 11/2008 Kohler .............. H01L 21/31116
257/532
2012/0289056 A1\* 11/2012 Bergman ............... C09K 13/04
438/757
2013/0148258 A1 6/2013 Chen \* cited by examiner

METHODS OF FORMING SEMICONDUCTOR DEVICE INCLUDING CAPACITORS WITH MODIFIED SIDEWALLS AND RELATED DEVICES

CROSS-REFERENCE TO RELATED APPLICATION

This application claims priority under 35 U.S.C. §119 to Korean Patent Application No. 10-2014-0010769 filed on Jan. 28, 2014, the disclosure of which is hereby incorporated by reference in its entirety.

FIELD

Embodiments of the inventive concept relate to methods of forming semiconductor devices including capacitors and related devices.

BACKGROUND

As semiconductor devices have become more highly integrated, concave capacitors have been implemented to overcome some of the structural limitations of pillar type capacitors or one-cylindrical stack (OCS) type capacitors. A concave capacitor can be formed using a hole in a molding layer, and forming a lower electrode, a dielectric layer and an upper electrode in the hole. Forming the hole to have a great aspect ratio may be advantageous in increasing capacitance of the capacitor, but may create problems due to the limitation in the patterning process.

Another method to overcome some of the limitations of the patterning process, while also forming the hole to have a greater aspect ratio, includes forming a lower molding layer on a substrate, and forming a lower hole that passes through the lower molding layer. A sacrificial layer can fill the lower hole and an upper molding layer can be formed on the lower molding layer and the sacrificial layer. An upper hole exposing the sacrificial layer through the upper molding layer can be formed. The sacrificial layer may be removed to connect the upper hole to the lower hole. Due to errors in the patterning process, however, the upper hole may slightly deviate from the lower hole and in a contact area of the upper hole and the lower hole, the upper hole may have a different size than the lower hole. Moreover, a sidewall of the upper and lower hole may have a sharp slope and create an under-cut in the contact area. The sidewall having a sharp slope may prevent the forming of the lower electrode close to the dielectric layer.

SUMMARY

Embodiments according to the inventive concept can provide methods of forming semiconductor devices including capacitors with modified sidewalls and related devices. Pursuant to these embodiments, a method of forming a semiconductor device can be provided by forming a first molding layer on a substrate and forming a first hole through the first molding layer. A second molding layer can be formed on the first molding layer so that the first hole is retained in the first molding layer and a second hole can be formed through the second molding layer to connect with the first hole. A capacitor electrode can be formed in the first and second holes.

In some embodiments according to the inventive concept, forming a second molding layer on the first molding layer can further include forming the second molding layer so that a side surface of the first molding layer in the first hole is left exposed after formation of the second molding layer. In some embodiments according to the inventive concept, a contact angle measured between a sidewall of the first hole and a sidewall of the second hole can be an obtuse angle.

In some embodiments according to the inventive concept, a left sidewall of the second hole and an opposing right sidewall of the second hole can have different profiles. In some embodiments according to the inventive concept, the first molding layer can include a first material having a first molding layer etch rate and the second molding layer can include a second material having a second molding layer etch rate that is greater than the first molding layer etch rate.

In some embodiments according to the inventive concept, forming a second molding layer can include forming a lower molding layer on the first molding layer, where the lower molding layer having a lower molding layer etch rate and forming an upper molding layer on the lower molding layer, the upper molding layer having an upper molding layer etch rate, where the lower molding layer etch rate is greater than the upper molding layer etch rate.

In some embodiments according to the inventive concept, a method of forming a semiconductor device can be provided by forming a first molding layer on a substrate, wherein the first molding layer has a first molding layer etch rate. A first hole can be etched through the first molding layer and a second molding layer can be formed on the first molding layer so that the first hole is retained in the first molding layer, and the second molding layer can have a second molding layer etch rate that is greater than the first molding layer etch rate. A second hole can be etched through the second molding layer to connect with the first hole and a lower capacitor electrode can be in the first and second holes. A dielectric layer can be formed on the lower capacitor electrode and an upper capacitor electrode can be formed to fill the first hole and the second hole, and to extend outside the second hole to cover an upper portion of the dielectric layer on second molding layer where an upper end of the lower capacitor electrode can be formed recessed to beneath an upper end of the second molding layer, the lower capacitor electrode contacts the first molding layer and the second molding layer, and the dielectric layer can extend outside the second hole to contact and cover the second molding layer.

In some embodiments according to the inventive concept, a semiconductor device can include a first molding layer on a substrate and a first hole through the first molding layer. A second molding layer can be on the first molding layer and a lower molding layer can be included in the second molding layer. An upper molding layer can be included in the second molding layer, and can be on the lower molding layer, wherein opposing sidewalls of first hole passing through the upper molding layer can have symmetrical profiles. A second hole can be through the upper and lower molding layers of the second molding layer to connect with the first hole, where opposing sidewalls of second hole that pass through the lower molding layer can have asymmetrical profiles and a first electrode can be in the first and second holes.

In some embodiments according to the inventive concept, a semiconductor device can include a first molding layer on a substrate, where the first molding layer can have a first molding layer etch rate. A first hole can pass through the first molding layer and a second molding layer can be on the first molding layer, where the second molding layer can have a second molding layer etch rate that is greater than the first molding layer etch rate. A second hole can pass through the second molding layer to connect to the first hole and a lower capacitor electrode can be in the first and second holes. A dielectric layer can be on the lower capacitor electrode and an upper capacitor electrode can be on the dielectric layer, where a left sidewall of the second hole can have a left sidewall profile and be opposite a right sidewall of the second hole which can have a right sidewall profile that is different from the left sidewall profile. An upper end of the lower capacitor electrode can be lower than an upper end of the second molding layer and the lower capacitor electrode can contact the first molding layer and the second molding layer, and the upper capacitor electrode can extend outside the second hole to cover an upper end of the second molding layer. The dielectric layer can extend outside the second hole to cover the upper end of the second molding layer, and the dielectric layer contacts the second molding layer.

In some embodiments according to the inventive concept, a method of forming a semiconductor device can be provided by forming a first molding layer on a substrate using a first deposition rate. A first hole can be through the first molding layer and a second molding layer can be formed on the first molding layer using a second deposition rate that is greater than the first deposition rate to from a dome shaped recess in the second molding layer covering the first hole. A second hole can be formed through the second molding layer to connect with the first hole, so that opposing sidewalls of the second hole at a boundary with the first molding layer are recessed outward from the dome shaped recess to provide a lip at the boundary that extends beyond opposing sidewalls of the first hole and a capacitor electrode can be formed in the first and second holes.

In some embodiments according to the inventive concept, forming a second molding layer on the first molding layer can further include forming the second molding layer so that a side surface of the first molding layer in the first hole is left exposed after formation of the second molding layer. In some embodiments according to the inventive concept, the opposing sidewalls of the second hole at the boundary can be asymmetrical to one another.

In some embodiments according to the inventive concept, forming the first molding layer can include forming a first insulating layer at a deposition rate of about 130 nm/min to about 150 nm/min. In some embodiments according to the inventive concept, forming a second molding layer can include forming a second insulating layer at a deposition rate of about 864 nm/min to about 896 nm/min. In some embodiments according to the inventive concept, the second molding layer can be tetraethyl orthosilicate (TEOS).

In some embodiments according to the inventive concept, forming a second molding layer can include forming the second molding layer to a thickness that is about one-half to about 2 times a diameter of the first hole.

In some embodiments according to the inventive concept, a capacitor structure in a semiconductor device can include a first molding layer on a substrate and a first hole through the first molding layer. A second molding layer can be on the first molding layer and a second hole can pass through the second molding layer to connecting with the first hole, where opposing sidewalls of the second hole at a boundary with the first molding layer can be recessed outward beyond opposing sidewalls of the first hole to provide a lip in the opposing sidewalls of the second hole at the boundary and a capacitor electrode can be in the first and second holes.

In some embodiments according to the inventive concept, the opposing sidewalls of the second hole at the boundary can be asymmetrical to one another. In some embodiments according to the inventive concept, respective profiles of the opposing sidewalls of the second hole can extend inward from the lip to within the opposing sidewalls of the first hole.

In some embodiments according to the inventive concept, the respective profiles can include respective inflection points where the respective profiles change from an inward curved profile to an outward curved profile. In some embodiments according to the inventive concept, the first molding layer can be a first insulating layer having a first etch rate and the second molding layer can be a second insulating layer having a second etch rate that is greater than the first etch rate.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DESCRIPTION OF EMBODIMENTS ACCORDING TO THE INVENTIVE CONCEPT

Figure 1:
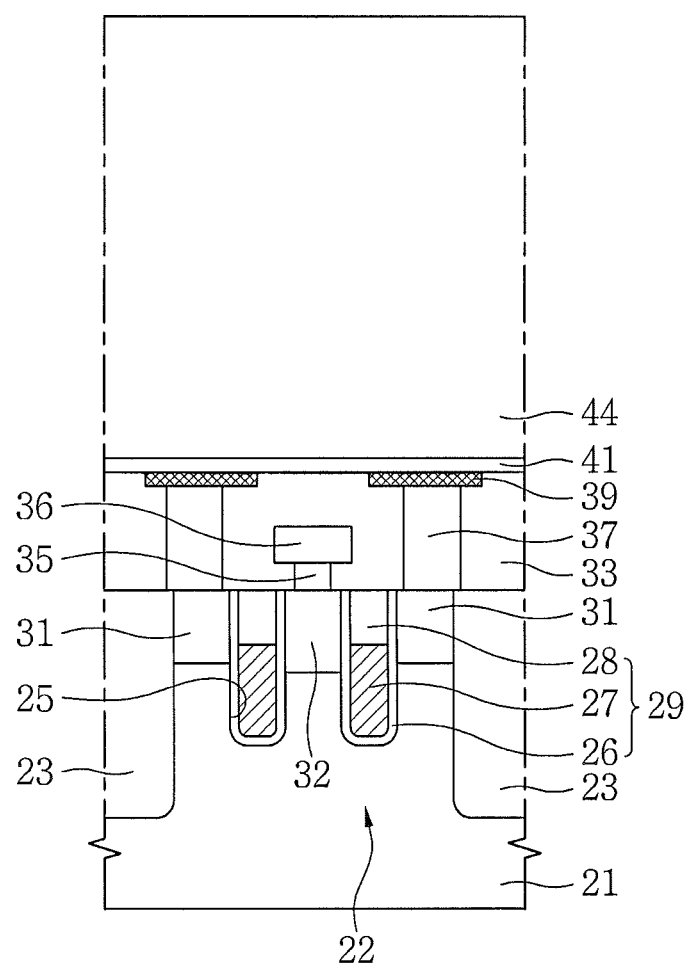
FIGS. 1 to 5, 10, 11, and 14 to 16 are cross-sectional views illustrating methods of forming semiconductor devices in accordance with embodiments of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art.

The terminology used herein to describe embodiments of the invention is not intended to limit the scope of the invention. The articles "a," "an," and "the" are singular in that they have a single referent; however, the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the sizes and relative sizes of layers and regions may be exaggerated for clarity. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. It will be understood that when two elements are described as "directly adjacent" to one another, no other of these elements are present between the two directly adjacent elements, even though the other types of element may be present between the two elements.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

The exemplary embodiments of the invention will be described with reference to cross-sectional views and/or plan views, which are ideal exemplary views. The drawings are of which thickness of layers and areas are exaggerated for effective describing of the technical contents. Forms of the embodiments may be modified by the manufacturing technology and/or tolerance. Therefore, the embodiments of the invention are not intended to limit to illustrated specific forms, and include modifications of forms generated according to the manufacturing processes. For example, an etching area illustrated a right angle may be round or having a predetermined curvature. Therefore, areas illustrated in the drawings have overview properties, shapes of the areas are illustrated special forms of the areas of a device, and is not intended to limit to the scope of the invention.

Hereinafter, like reference numerals in the drawings and description denote like elements. Therefore, although like reference numerals or similar reference numerals are not mentioned or described in the drawing, it will be described with reference to the other drawings. Further, although reference numerals are not illustrated, it will be described with reference to the other drawings.

Terms such as "front side" and "back side" may be used in a relative sense herein to facilitate easy understanding of the inventive concept. Accordingly, "front side" and "back side" may not refer to any specific direction, location, or component, and may be used interchangeably. For example, "front side" may be interpreted as "back side" and vice versa. Also, "front side" may be expressed as "first side," and "back side" may be expressed as "second side," and vice versa.

The term "near" is intended to mean that one among two or more components is located within relatively close proximity of a certain other component. For example, it should be understood that when a first end is near a first side, the first end may be closer to the first side than a second end, or the first end may be closer to the first side than to a second side.

Figure 12:
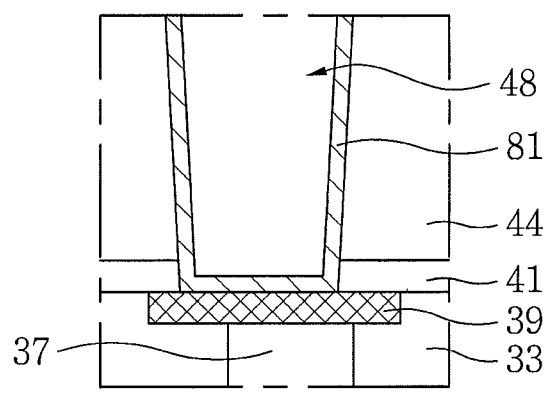
FIGS. 12 and 13 are enlarged views showing a part of FIG. 11 in more detail.
Figure 13:
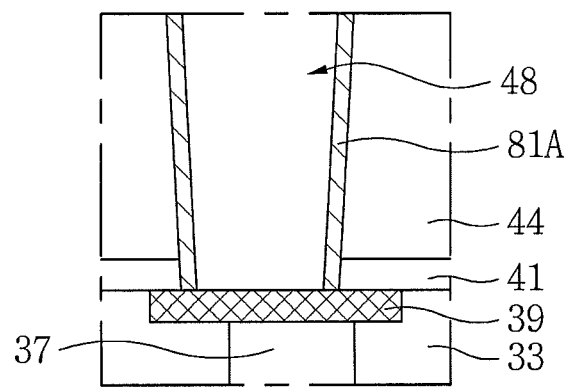

FIGS. 1 to 5, 10, 11, and 14 to 16 are cross-sectional views illustrating methods of forming semiconductor devices in accordance with embodiments of the inventive concept. FIGS. 6 to 9 are enlarged views showing a part of FIG. 5 in detail, FIGS. 12 and 13 are enlarged views showing a part of FIG. 11 in more detail, and FIGS. 17 to 20 are enlarged views showing a part of FIG. 16 in more detail.

Referring to FIG. 1, an isolation layer 23 may be formed on a substrate 21 to define an active area 22. Gate trenches 25 may be formed to cross the active area 22. Gate structures 29 may be formed in the gate trenches 25. Each of the gate structures 29 may include a gate dielectric layer 26, a gate electrode 27, and a gate capping pattern 28. First and second source/drain areas 31 and 32 may be formed in the active area 22 adjacent to the gate structures 29.

An interlayer insulating layer 33 may be formed on the gate structures 29 and the first and second source/drain areas 31 and 32. A bit plug 35 and a bit line 36 may be formed in the interlayer insulating layer 33. Buried contact plugs 37 connected to the first source/drain areas 31 through the interlayer insulating layer 33 may be formed. Landing pads 39 may be formed on the buried contact plugs 37. An etch-stop layer 41 may be formed on the interlayer insulating layer 33 and the landing pads 39. A first molding layer 44 may be formed on the etch-stop layer 41.

The first and second source/drain areas 31 and 32, the active area 22, the gate dielectric layer 26, and the gate electrode 27 may constitute a transistor. Several of the transistors may be formed repetitively in row and column directions on the substrate 21. The transistor may serve as a switching device. In other embodiments, the switching device may be a planar transistor, a sphere-shaped recess channel array transistor (SRCAT), a 3-dimensional (3D) transistor, a nano-wire transistor, a vertical transistor or a combination thereof.

The substrate 21 may be a semiconductor substrate such as a silicon wafer. The isolation layer 23 may be formed using a shallow trench isolation (STI) technique. The isolation layer 23 may include silicon oxide, silicon nitride, silicon oxynitride or combinations thereof. Each of the gate trenches 25 may cross the active area 22, and extend in the isolation layer 23. An upper end of the gate electrode 27 may be formed at a lower level than upper ends of the first and second source/drain areas 31 and 32. The gate capping pattern 28 may be formed on the gate electrode 27. The gate dielectric layer 26 may be formed between the gate electrode 27 and the active area 22. The second source/drain area 32 may be formed between the gate structures 29. The first source/drain areas 31 may be formed between the gate structures 29 and the isolation layer 23.

The gate dielectric layer 26 may include silicon oxide, silicon nitride, silicon oxynitride, a high-K dielectric layer or combinations thereof. The gate electrode 27 may include a conductive layer such as a metal, a metal silicide, a semiconductor, poly-silicon or a combination thereof. The gate capping pattern 28 may include silicon oxide, silicon nitride, silicon oxynitride, a low-K dielectric layer or combinations thereof.

The interlayer insulating layer 33 may include silicon oxide, silicon nitride, silicon oxynitride, a low-K dielectric layer or combinations thereof. The interlayer insulating layer 33 may cover the entire surface of the substrate 21. The bit plug 35 may be in contact with the second source/drain area 32 and the bit line 36. The bit plug 35 may include a conductive layer such as a metal, a metal silicide, a semiconductor or combinations thereof. The bit line 36 may include a conductive layer such as a metal, a metal silicide, a semiconductor or combinations thereof.

The buried contact plugs 37 may be in contact with the first source/drain areas 31. The buried contact plugs 37 may include a conductive layer such as a metal, a metal silicide, a semiconductor or combinations thereof. For example, the buried contact plugs 37 may include W, Ru, Ti, TiN or a combination thereof. Each of the landing pads 39 may be in contact with a selected one of the buried contact plugs 37. The landing pads 39 may have a greater width than the buried contact plugs 37. Vertical centers of the landing pads 39 may be formed to deviate from vertical centers of the buried contact plugs 37. The landing pads 39 may include a conductive layer such as a metal, a metal silicide, a semiconductor or combinations thereof.

The etch-stop layer 41 may cover the interlayer insulating layer 33 and the landing pads 39. The etch-stop layer 41 may include silicon oxide, silicon nitride, silicon oxynitride or combinations thereof. The first molding layer 44 may be thicker than the etch-stop layer 41. An upper end of the first molding layer 44 may be planarized. A chemical mechanical polishing (CMP) process, an etch-back process or a combination thereof may be applied to planarization of the first molding layer 44. The first molding layer 44 may include silicon oxide, silicon nitride, silicon oxynitride, a low-K dielectric layer or combinations thereof. The etch-stop layer 41 may include a material having an etch selectivity with respect to the first molding layer 44. For example, the etch-stop layer 41 may include silicon nitride, and the first molding layer 44 may include silicon oxide.

Figure 2:
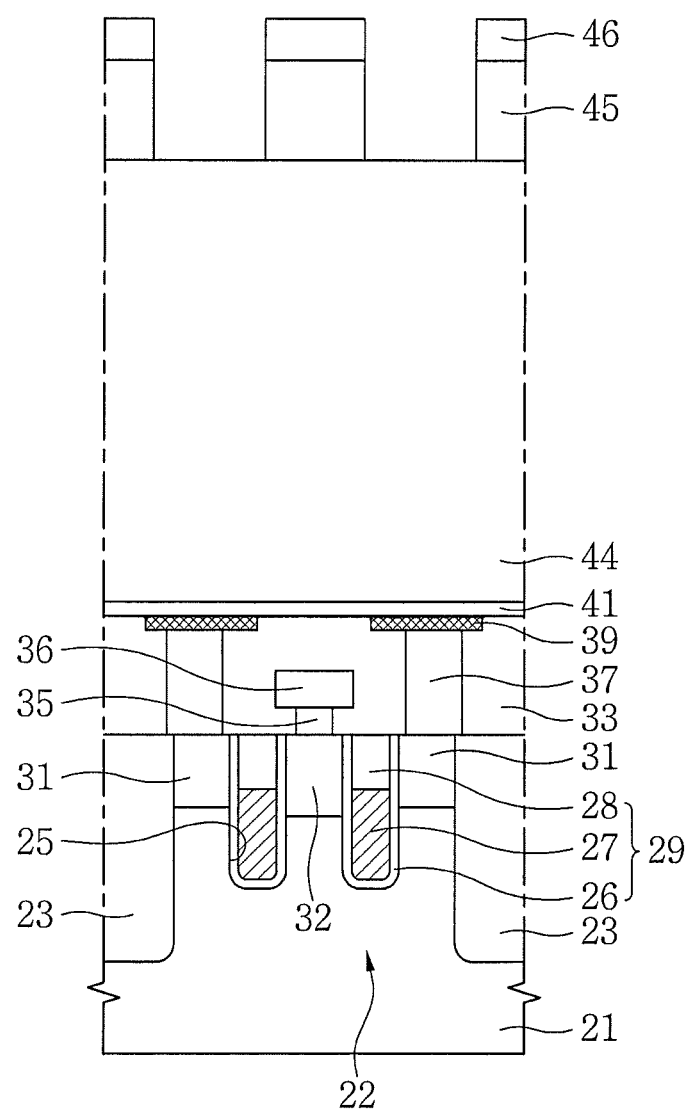

Referring to FIG. 2, a hard mask pattern 45 and a photoresist pattern 46 may be formed on the first molding layer 44. The hard mask pattern 45 may include a material having an etch selectivity with respect to the first molding layer 44. For example, the hard mask pattern 45 may include poly-silicon.

Figure 3:
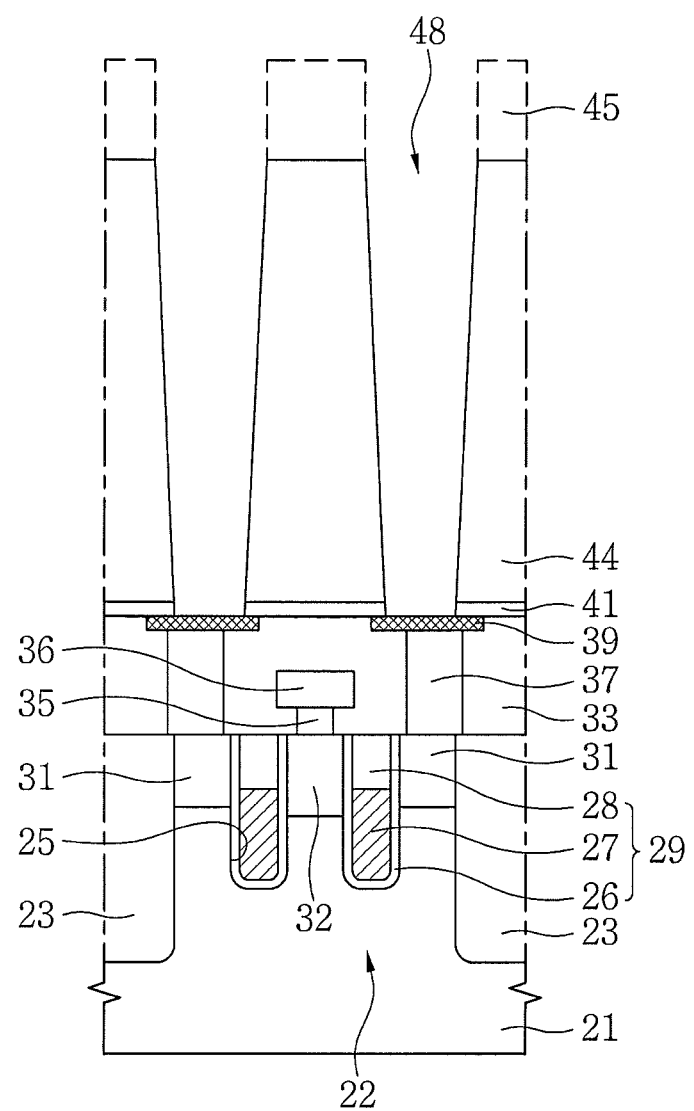

Referring to FIG. 3, first holes 48 may be formed to expose the landing pads 39 through the first molding layer 44 and the etch-stop layer 41. In each of the first holes 48, a vertical height may be greater than a horizontal width. Each of the first holes 48 may have a high aspect ratio. For example, each of the first holes 48 may have an aspect ratio of 10:1 to 30:1. In each of the first holes 48, an upper portion may have a greater width than a lower portion. An anisotropic etching process in which the hard mask pattern 45 is used as an etching mask, may be used to form the first holes 48. An upper surface of the first molding layer 44 may be exposed by removing the hard mask pattern 45.

Figure 4:
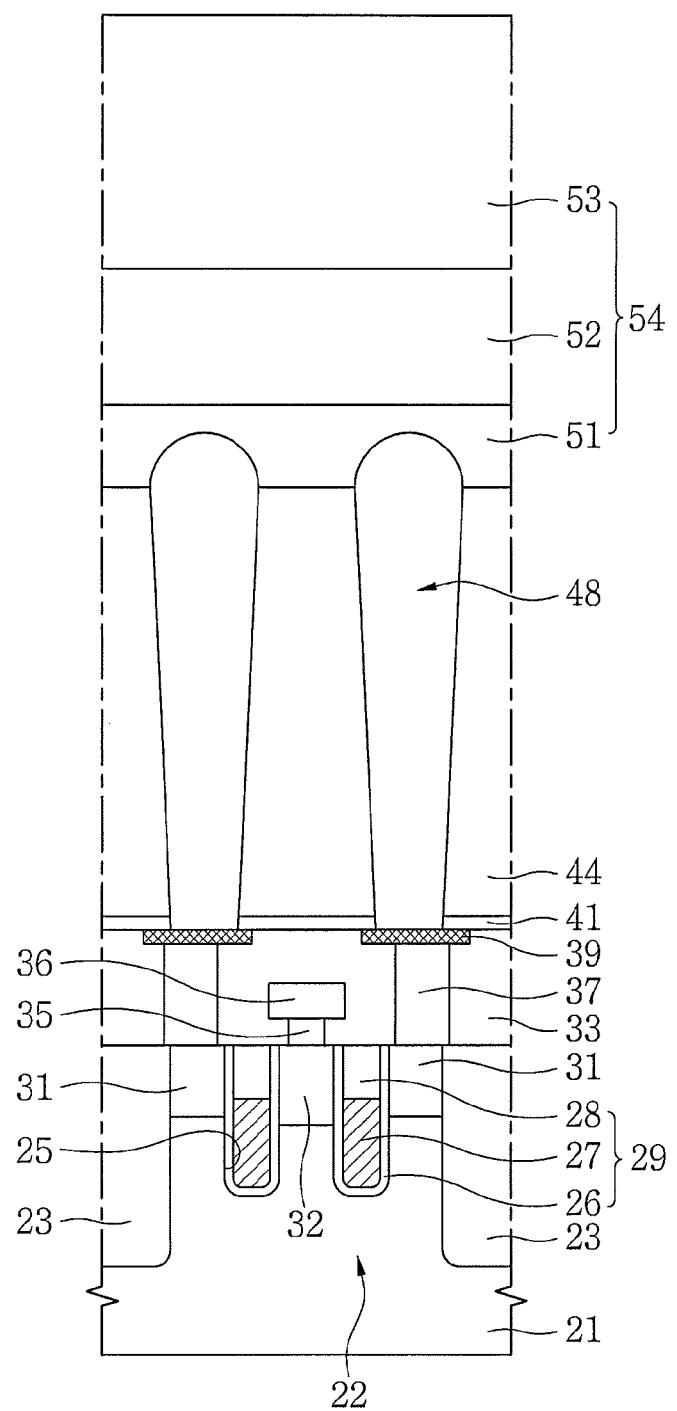

Referring to FIG. 4, a second molding layer 54 may be formed on the first molding layer 44 having the first holes 48. The second molding layer 54 may include a lower molding layer 51, a middle molding layer 52, and an upper molding layer 53. The second molding layer 54 may cover the first holes 48. The first holes 48 may be retained in the first molding layer 44. The second molding layer 54 may include an insulating layer such as silicon oxide, silicon nitride, silicon oxynitride or a combination thereof.

The lower molding layer 51 may be formed between the first molding layer 44 and the middle molding layer 52. The lower molding layer 51 may be in direct contact with the first molding layer 44. The lower molding layer 51 may be a low conformal layer. The lower molding layer 51 may be formed using a high rate deposition technique. For example, the lower molding layer 51 may be formed at a greater deposition rate than the first molding layer 44 using a chemical vapor deposition (CVD) technique. The lower molding layer 51 may have a relatively higher etch rate than the first molding layer 44. The lower molding layer 51 may include tetraethyl orthosilicate (TEOS).

A thickness of the lower molding layer 51 may be 0.5 to 2 times a horizontal width of the first hole 48. For example, in some embodiments, the thickness of the lower molding layer 51 may be about equal to the horizontal width of the first hole 48. In some embodiments according to the inventive concept, the thickness of the lower molding layer 51 may be about 50 nm. The first holes 48 may be covered with the lower molding layer 51, and the first holes 48 may be retained in the first molding layer 44. An internal space of the first holes 48 may be retained in the first molding layer 44. Side surfaces of the first molding layer 44 may be exposed in the first holes 48.

In other embodiments, the lower molding layer 51 may partially penetrate through an upper end area of the first holes 48.

The middle molding layer 52 may be formed between the lower molding layer 51 and the upper molding layer 53. The middle molding layer 52 may be thicker than the lower molding layer 51. The middle molding layer 52 may have a relatively lower etch rate than the lower molding layer 51. For example, the middle molding layer 52 may include borophosphosilicate glass (BPSG).

The upper molding layer 53 may cover the middle molding layer 52. The upper molding layer 53 may be thicker than the lower molding layer 51. The upper molding layer 53 may have a relatively lower etch rate than the middle molding layer 52. For example, the upper molding layer 53 may include a high density plasma (HDP) oxide.

In some embodiments, the lower molding layer 51, the middle molding layer 52, and the upper molding layer 53 may be formed using a high rate deposition technique having a higher deposition rate than the first molding layer 44. The lower molding layer 51 may include an insulating layer formed at a higher deposition rate than the first molding layer 44. The middle molding layer 52 may include an insulating layer formed at a higher deposition rate than the upper molding layer 53. The lower molding layer 51 may include an insulating layer formed at a higher deposition rate than the middle molding layer 52. For example, the first molding layer 44 may include an insulating layer formed at a deposition rate of 130 nm/min to 150 nm/min, the lower molding layer 51 may include an insulating layer formed at a deposition rate of 864 nm/min to 896 nm/min, and the upper molding layer 53 may include an insulating layer formed at a deposition rate of 327 nm/min to 339 nm/min. The first molding layer 44 may include an insulating layer formed at a deposition rate of about 140 nm/min, the lower molding layer 51 may include an insulating layer formed at a deposition rate of about 880 nm/min, and the upper molding layer 53 may include an insulating layer formed at a deposition rate of about 333 nm/min.

Figure 5:
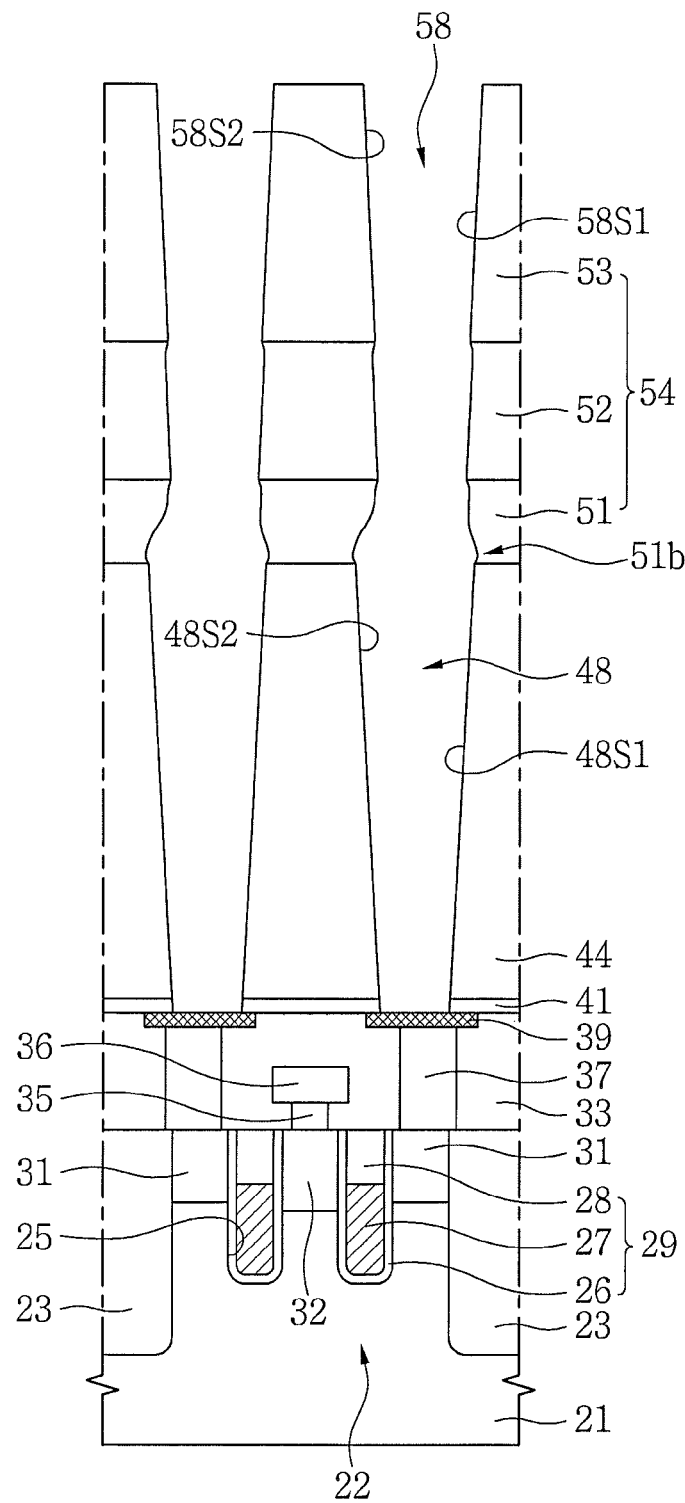

Referring to FIG. 5, second holes 58, in communication with the first holes 48 through the second molding layer 54, may be formed. A vertical height of each of the second holes 58 may be greater than a horizontal width. Each of the second holes 58 may have a high aspect ratio. In some embodiments, each of the second holes 58 may have an aspect ratio of 10:1 to 30:1. A photolithography process and an etching process may be applied when forming the second holes 58. Due to an alignment error of the photolithography process, a center of the second hole 58 may deviate from a center of the first hole 48. For example, a straight line passing through the center of the second hole 58 and perpendicular to the substrate 21 may slightly deviate from a straight line passing through the center of the first hole 48 and be perpendicular to the substrate 21.

A first right sidewall 48S1, a second right sidewall 58S1, a first left sidewall 48S2, and a second left sidewall 58S2 may be formed. The first hole 48 may include the first right sidewall 48S1 and the first left sidewall 48S2, which face each other. The second hole 58 may include the second right sidewall 58S1 and the second left sidewall 58S2, which face each other.

As shown in FIG. 5, opposing sidewalls of the second hole 58 at a boundary with the first molding layer 44 are recessed outward beyond opposing sidewalls of the first hole 48 to provide a lip 51b in the opposing sidewalls of the second hole at the boundary. As further shown in FIG. 5, the opposing sidewalls of the second hole 58 at the boundary are asymmetrical to one another (see also FIG. 6). Moreover, respective profiles of the opposing sidewalls extend inward from the lip to within the opposing sidewalls at the lip 51b of the first hole 48. The respective profiles each include respective inflection points where the respective profile changes from inward to outward when extending in the direction of the opening of the second hole 58.

Figure 6:
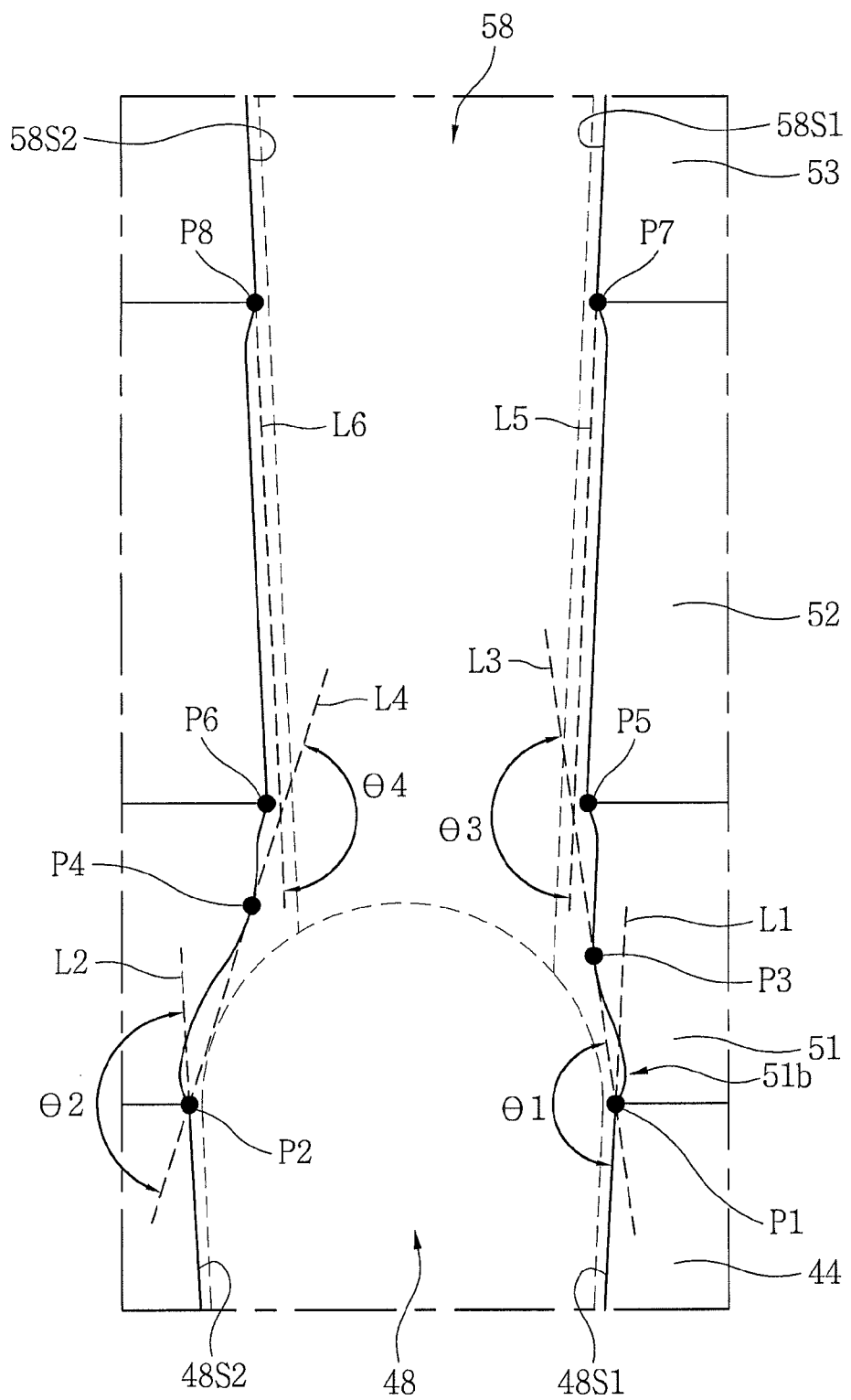
FIGS. 6 to 9 are enlarged views showing a part of FIG. 5 in more detail.

Referring to FIG. 6, an anisotropic etching process and an isotropic etching process may be applied when forming the second holes 58. The first holes 48 may be extended while the second holes 58 are formed. The lower molding layer 51 may include a material having a higher etch rate than the first molding layer 44. The middle molding layer 52 may include a material having a higher etch rate than the upper molding layer 53, and a lower etch rate than the lower molding layer 51.

First to eighth points P1, P2, P3, P4, P5, P6, P7, and P8 may be defined. The first point P1 may be defined as an intersection of the first right sidewall 48S1 and the second right sidewall 58S1. The second point P2 may be defined as an intersection of the first left sidewall 48S2 and the second left sidewall 58S2. The first point P1 and the second point P2 may be located at a boundary of the first molding layer 44 and the lower molding layer 51. Each of the first point P1 and the second point P2 may correspond to an inflection point.

The third point P3 may be located on the second right sidewall 58S1, located on the lower molding layer 51, and located at a higher level than the first point P1. The fourth point P4 may be located on the second left sidewall 58S2, located on the lower molding layer 51, and located at a higher level than the second point P2. Each of the third point P3 and the fourth point P4 may correspond to an inflection point.

The fifth point P5 may be located on the second right sidewall 58S1, at a boundary of the lower molding layer 51 and the middle molding layer 52, and located at a higher level than the third point P3. The sixth point P6 may be located on the second left sidewall 58S2, at a boundary of the lower molding layer 51 and the middle molding layer 52, and located at a higher level than the fourth point P4. Each of the fifth point P5 and the sixth point P6 may correspond to an inflection point.

The seventh point P7 may be located on the second right sidewall 58S1, located at a boundary of the middle molding layer 52 and the upper molding layer 53, and located at a higher level than the fifth point P5. The eighth point P8 may be located on the second left sidewall 58S2, at a boundary of the middle molding layer 52 and the upper molding layer 53, and located at a higher level than the sixth point P6. Each of the seventh point P7 and the eighth point P8 may correspond to an inflection point.

First to sixth straight lines L1, L2, L3, L4, L5, and L6 may be defined. The first straight line L1 may be defined as a straight line which is parallel to the first right sidewall 48S1, in the first molding layer 44 and which passes through the first point P1. The second straight line L2 may be defined as a straight line which is parallel to the first left sidewall 48S2 in the first molding layer 44 and passes through the second point P2. The third straight line L3 may be defined as a straight line passing through the first point P1 and the third point P3. The fourth straight line L4 may be defined as a straight line passing through the second point P2 and the fourth point P4. The fifth straight line L5 may be defined as a straight line which is parallel to the second right sidewall 58S1 in the upper molding layer 53 and passes through the seventh point P7. The sixth straight line L6 may be defined as a straight line which is parallel to the second left sidewall 58S2 in the upper molding layer 53 and passes through the eighth point P8.

The first straight line L1 and the third straight line L3 may have a first intersection angle ($\theta 1$). The second straight line L2 and the fourth straight line L4 may have a second intersection angle ($\theta 2$). The third straight line L3 and the fifth straight line L5 may have a third intersection angle ($\theta 3$). The fourth straight line L4 and the sixth straight line L6 may have a fourth intersection angle ($\theta 4$).

The second right sidewall 58S1 may be in contact with the first right sidewall 48S1. A contact area between the second right sidewall 58S1 and the first right sidewall 48S1 may be a gentle slope. A contact angle between the second right sidewall 58S1 and the first right sidewall 48S1 may be an obtuse angle. Each of the first intersection angle ($\theta 1$) and the third intersection angle ($\theta 3$) may be an obtuse angle. The second left sidewall 58S2 may be in contact with the first left sidewall 48S2. A contact area between the second left sidewall 58S2 and the first left sidewall 48S2 may be a gentle slope. A contact angle between the second left sidewall 58S2 and the first left sidewall 48S2 may be an obtuse angle. Each of the second intersection angle ($\theta 2$) and the fourth intersection angle (θ4) may be an obtuse angle. Each of the first intersection angle (θ1), the second intersection angle (θ2), the third intersection angle (θ3), and the fourth intersection angle (θ4) may be 150° to 179°.

The second right sidewall 58S1 and the second left sidewall 58S2 may have different profiles from each other. The second right sidewall 58S1 and the second left sidewall 58S2 may be sloped at different angles. The third point P3 and the fourth point P4 may be formed at different vertical levels from each other. The fourth point P4 may be formed at a higher level than the third point P3. The first intersection angle (θ1) may be different from the second intersection angle (θ2). The third intersection angle (θ3) may be different from the fourth intersection angle (θ4).

Figure 7:
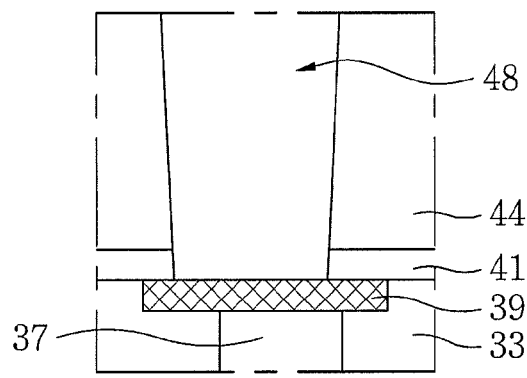

Referring to FIG. 7, a side surface of the etch-stop layer 41 in the first hole 48 may be vertically aligned with a side surface of the first molding layer 44 in the first hole 48.

Figure 8:
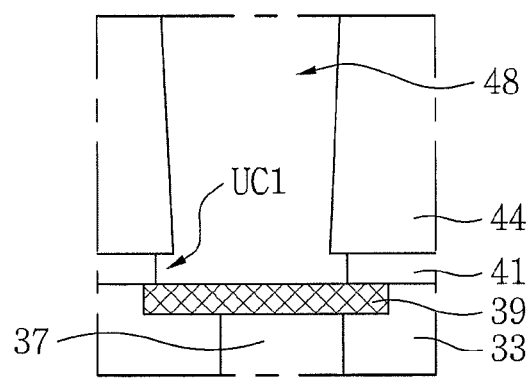

Referring to FIG. 8, in some embodiments, an undercut area UC1 may be formed under the first molding layer 44. The side surface of the etch-stop layer 41 may therefore be recessed from the side surface of the first molding layer 44.

Figure 9:
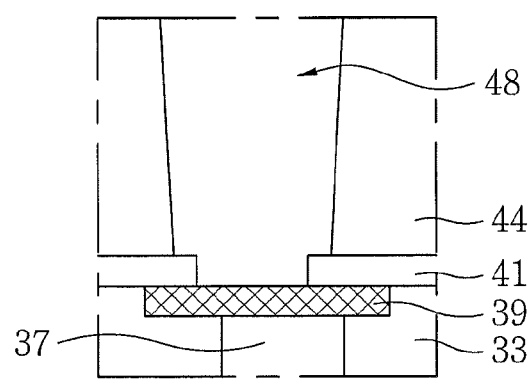

Referring to FIG. 9, in some embodiments, the etch-stop layer 41 may have a profile that protrudes into the first hole 48 beyond the side surface of the first molding layer 44. An upper surface and side surfaces of the etch-stop layer 41 may be exposed at a lower end area of the first hole 48.

Figure 10:
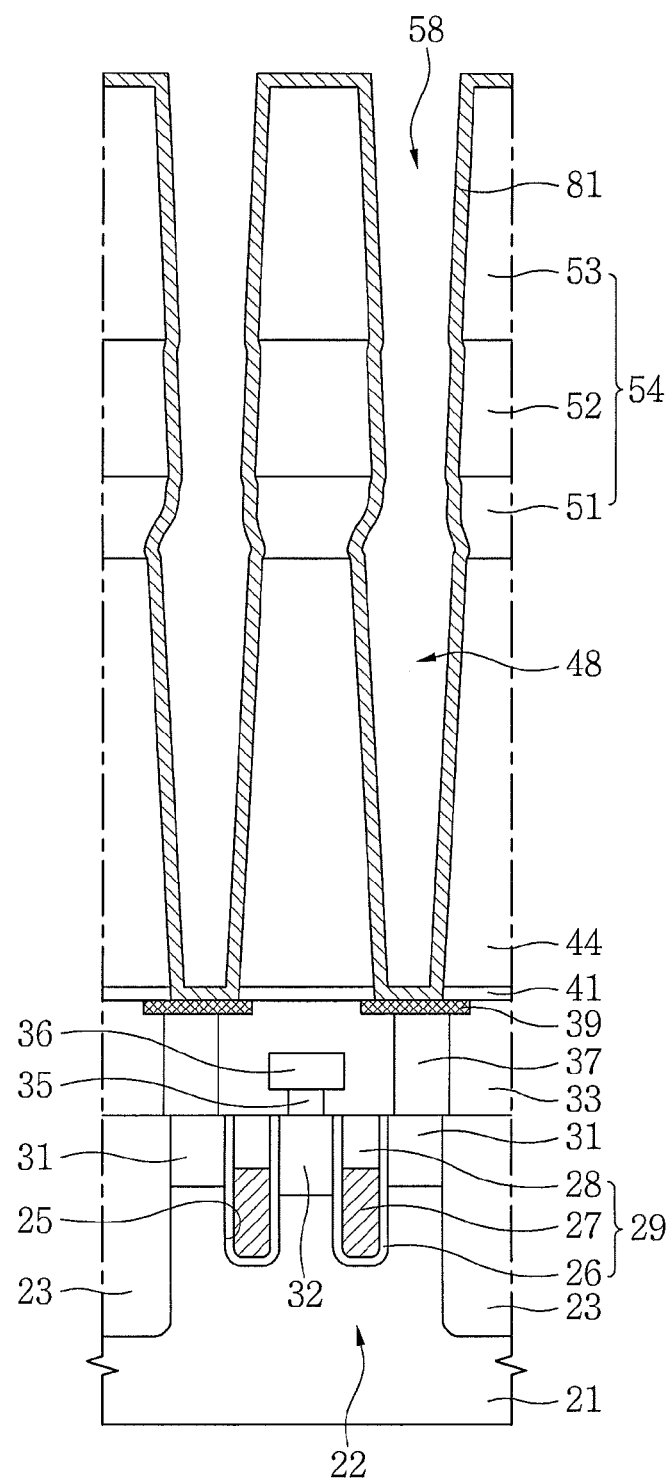

Referring to FIG. 10, a lower electrode 81 may be formed to cover inner walls of the first holes 48 and the second holes 58 and cover the second molding layer 54. The lower electrode 81 may be in contact with the landing pads 39. The lower electrode 81 may uniformly and closely conformally cover the sidewalls of the first holes 48 and the second holes 58. The lower electrode 81 may make contact with the etch-stop layer 41, the first molding layer 44, and the second molding layer 54. The lower electrode 81 may include a metal layer such as a Ru layer, a RuO layer, a Pt layer, a PtO layer, an Ir layer, an IrO layer, a SrRuO (SRO) layer, a (Ba,Sr)RuO (BSRO) layer, a CaRuO (CRO) layer, a BaRuO layer, a La(Sr,Co)O layer, a Ti layer, a TiN layer, a W layer, a WN layer, a Ta layer, a TaN layer, a TiAlN layer, a TiSiN layer, a TaAlN layer, a TaSiN layer, or combinations thereof. For example, the lower electrode 81 may include a TiN layer.

Figure 11:
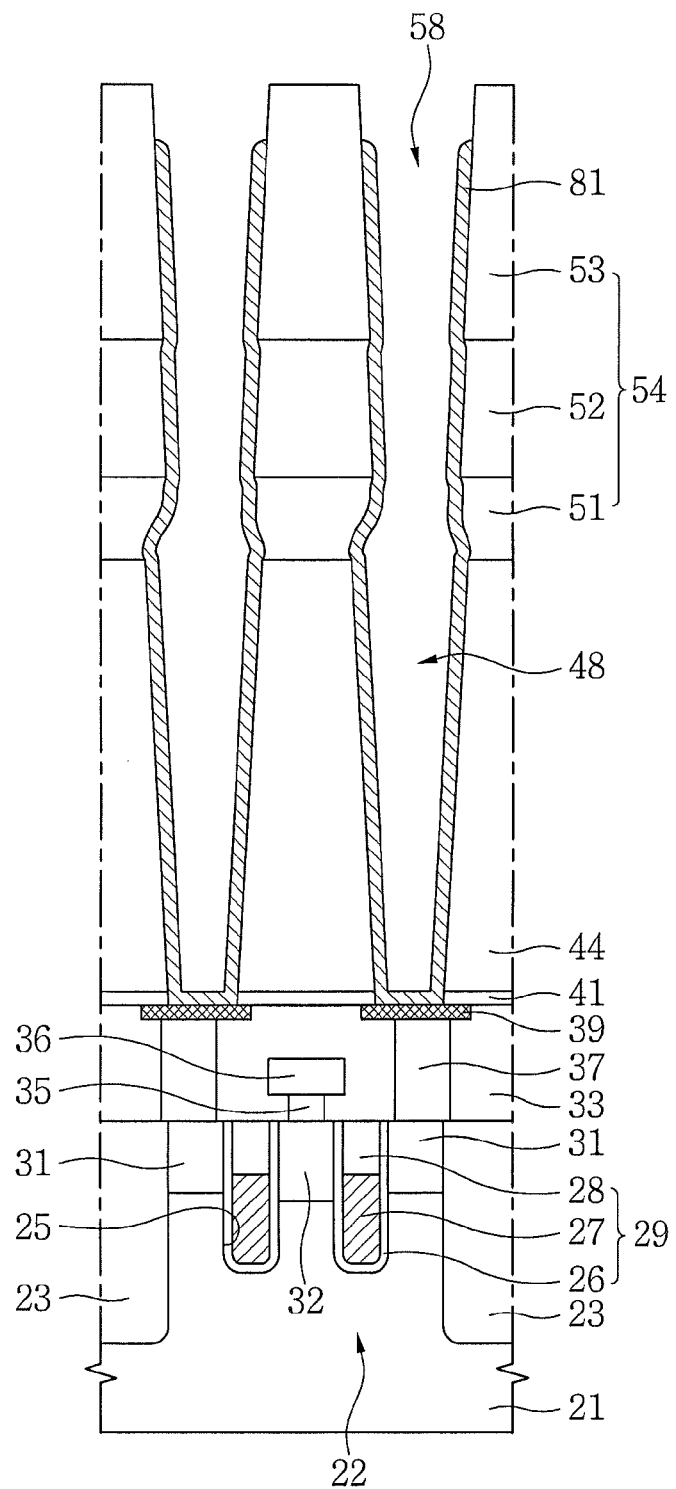

Referring to FIG. 11, upper ends of the second molding layer 54 may be exposed by partially removing the lower electrode 81 using an etch-back process. Anisotropic etching process may be applied to partially remove the lower electrode 81. The lower electrode 81 may be retained in the first holes 48 and the second holes 58. A side surface of the second molding layer 54 may be partially exposed to an upper end area of the second holes 58. An upper end of the lower electrode 81 may be recessed into the second holes 58 to beneath an upper end of the second molding layer 54.

Referring to FIG. 12, due to a high aspect ratio of the first holes 48 and the second holes 58, the lower electrode 81 may be retained on the landing pads 39 during the etch-back process. The lower electrode 81 may fully cover the landing pads 39.

Referring to FIG. 13, in some embodiments, a lower electrode 81A may be retained on a sidewall of the first holes 48, whereas the landing pads 39 may be partially exposed at a lower end of the first holes 48.

Figure 14:
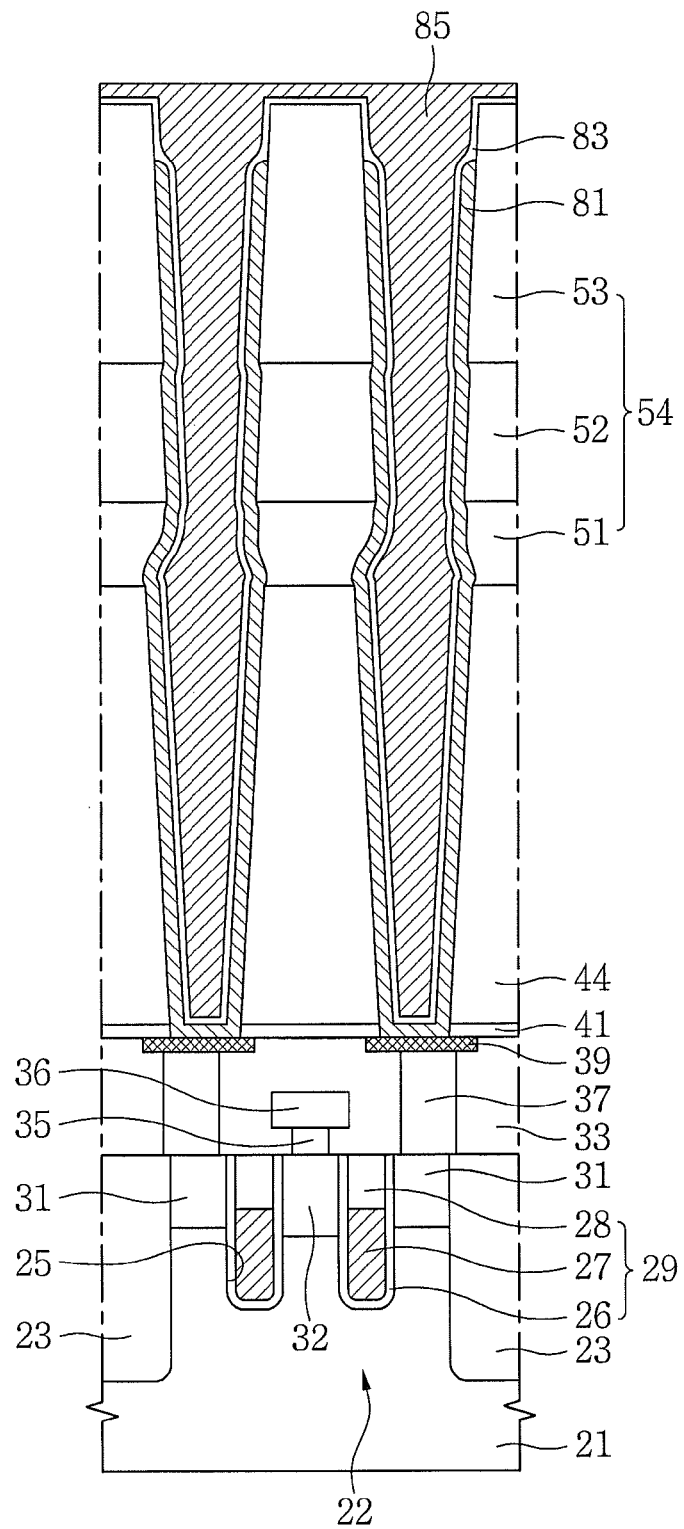

Referring to FIG. 14, a capacitor dielectric layer 83 may be formed on the lower electrode 81. The capacitor dielectric layer 83 may cover the lower electrode 81 and the second molding layer 54. The capacitor dielectric layer 83 may be in contact with the lower electrode 81 and the second molding layer 54. The capacitor dielectric layer 83 may be in contact with an upper surface and side surfaces of the second molding layer 54. The capacitor dielectric layer 83 may include a TaO layer, a TaAlO layer, a TaON layer, an AlO layer, an HfO layer, a ZrO layer, a ZrSiO layer, a TiO layer, a TiAlO layer, a (Ba,Sr)TiO (BST) layer, an SrTiO (STO) layer, a BaTiO (BTO) layer, a Pb(Zr,Ti)O (PZT) layer, a (Pb,La)(Zr,Ti)O layer, a Ba(Zr,Ti)O layer, a Sr(Zr,Ti)O layer or combinations thereof. For example, in some embodiments the capacitor dielectric layer 83 may be a ZrO layer.

An upper electrode 85 may be formed on the capacitor dielectric layer 83. The upper electrode 85 may be in contact with the capacitor dielectric layer 83. The upper electrode 85 may fill the first holes 48 and the second holes 58, and cover an upper portion of the second molding layer 54. The capacitor dielectric layer 83 may be interposed between the lower electrode 81 and the upper electrode 85. The upper electrode 85 may include a metal layer such as a Ru layer, a RuO layer, a Pt layer, a PtO layer, an Ir layer, an IrO layer, a SrRuO (SRO) layer, a (Ba,Sr)RuO (BSRO) layer, a CaRuO (CRO) layer, a BaRuO layer, a La(Sr,Co)O layer, a Ti layer, a TiN layer, a W layer, a WN layer, a Ta layer, a TaN layer, a TiAlN layer, a TiSiN layer, a TaAlN layer, a TaSiN layer or combinations thereof. For example, in some embodiments the upper electrode 85 may include a TiN layer.

Figure 15:
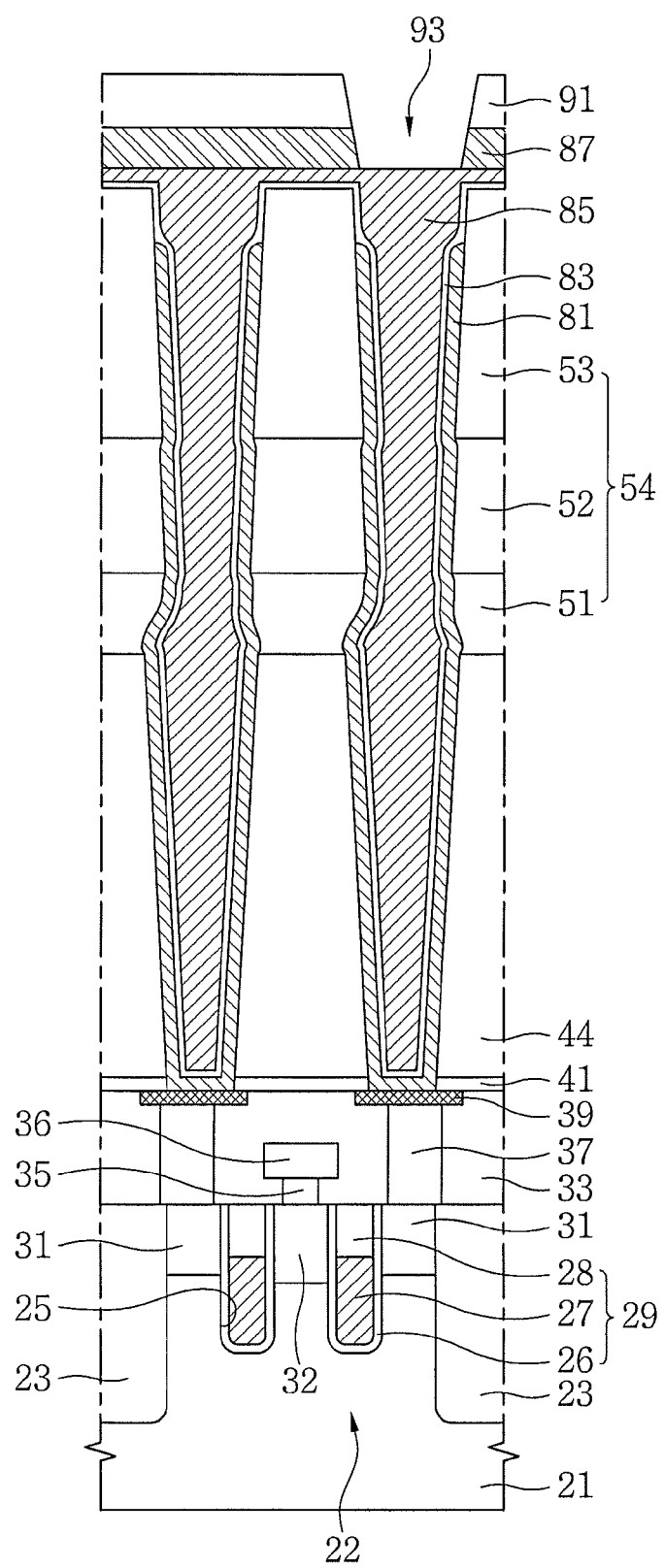

Referring to FIG. 15, a conductive layer 87 may be formed on the upper electrode 85. An upper insulating layer 91 may be formed on the conductive layer 87. A contact hole 93 may be formed through the upper insulating layer 91 and the conductive layer 87. The upper electrode 85 may be exposed at the bottom of the contact hole 93.

The conductive layer 87 may include a metal, a metal nitride, a metal silicide, a semiconductor or a combination thereof. The conductive layer 87 may include a material having an etch selectivity with respect to the upper electrode 85. For example, the conductive layer 87 may include SiGe. The upper insulating layer 91 may include silicon oxide, silicon nitride, silicon oxynitride or a combination thereof.

In some embodiments, the bottom of the contact hole 93 may be located in the conductive layer 87 so that some portion of the conductive layer 87 remains at the bottom of the contact hole 93.

Figure 16:
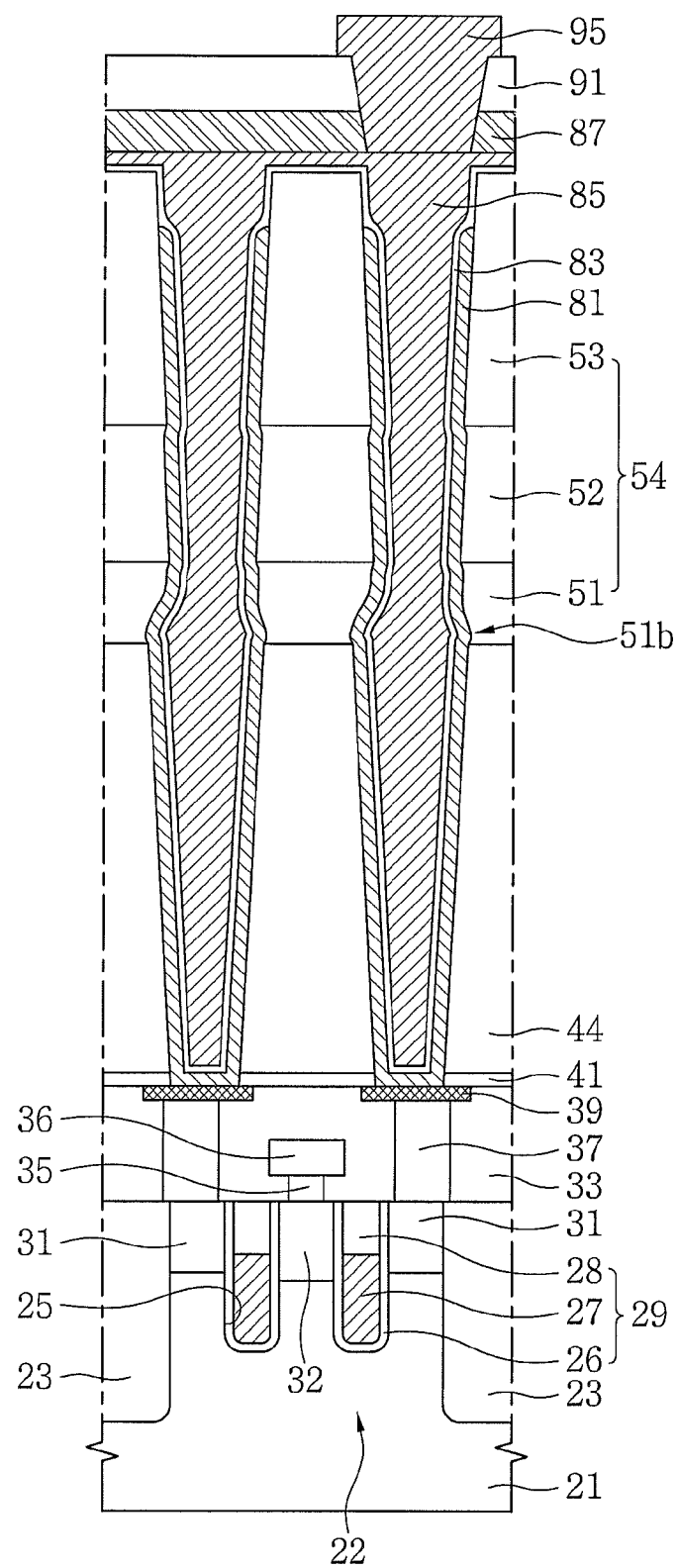

Referring to FIG. 16, an interconnection 95 may be formed to fill the contact hole 93 and extend outside the contact hole 93 onto a surface of the upper insulating layer 91. The interconnection 95 may include a metal, a metal nitride, conductive carbon or a combination thereof. The interconnection 95 may be electrically connected to the upper electrode 85.

Figure 17:
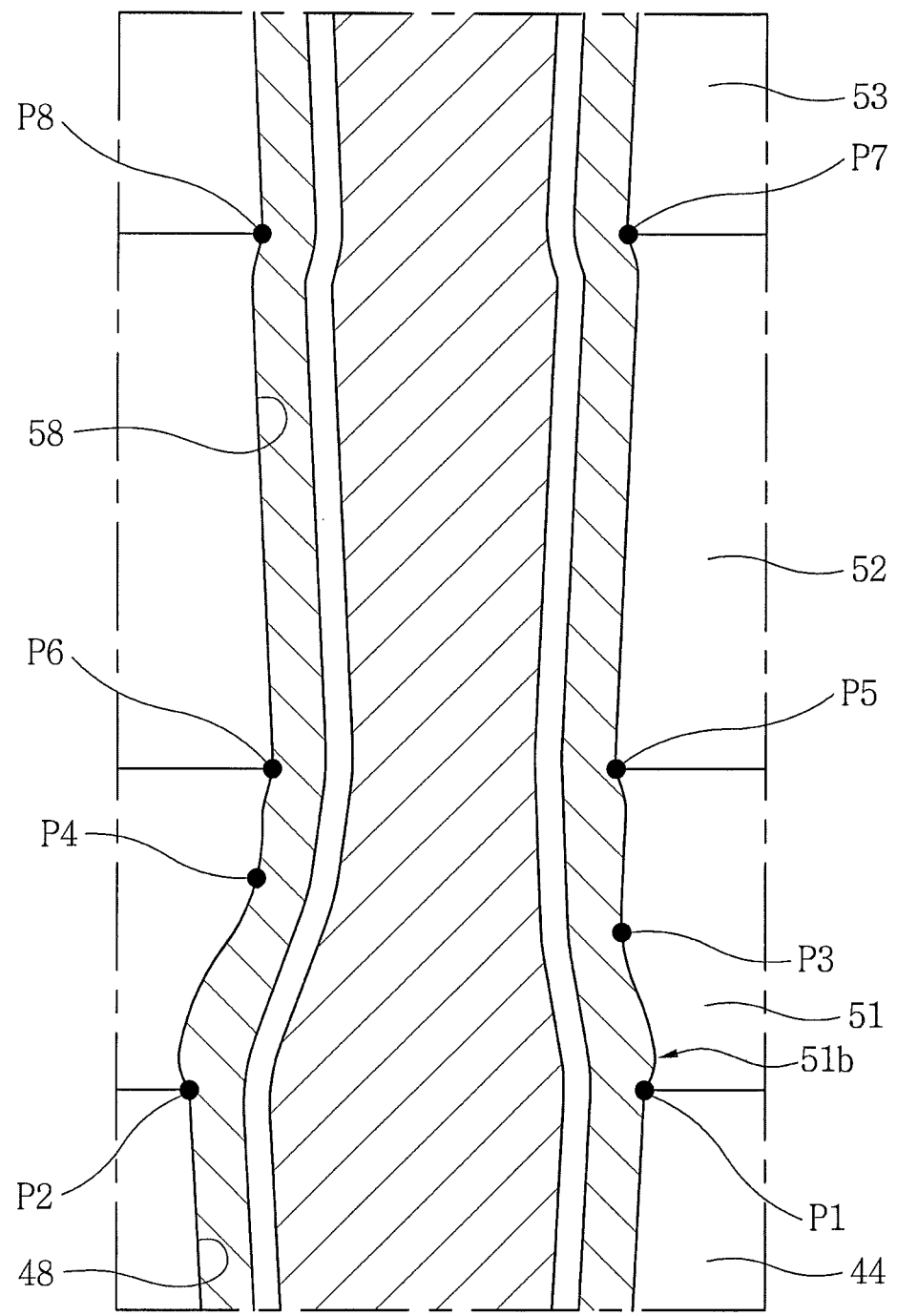
FIGS. 17 to 20 are enlarged views showing a part of FIG. 16 in more detail.

Referring to FIG. 17, a contact area of the first hole 48 and the second hole 58 may have a gentle slope. The lower electrode 81 and the capacitor dielectric layer 83 may uniformly and closely conformally cover sidewalls of the first holes 48 and the second holes 58.

Figure 18:
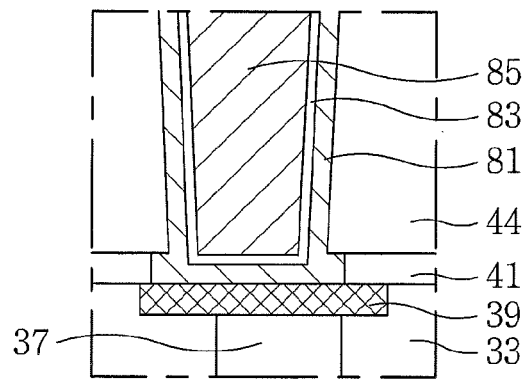

Referring to FIG. 18, the lower electrode 81 may be in contact with a lower surface of the first molding layer 44 and in contact with a sidewall of the etch-stop layer 41.

Figure 19:
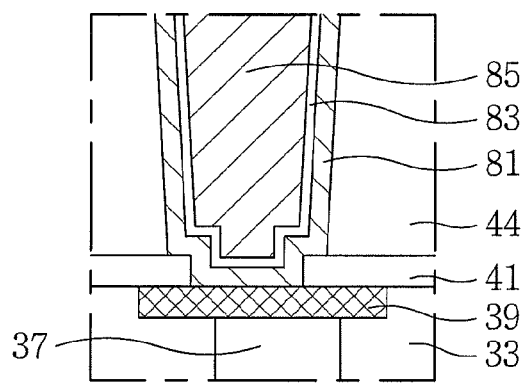

Referring to FIG. 19, the lower electrode 81 may be in contact with a side surface and an upper surface of the etch-stop layer 41.

Figure 20:
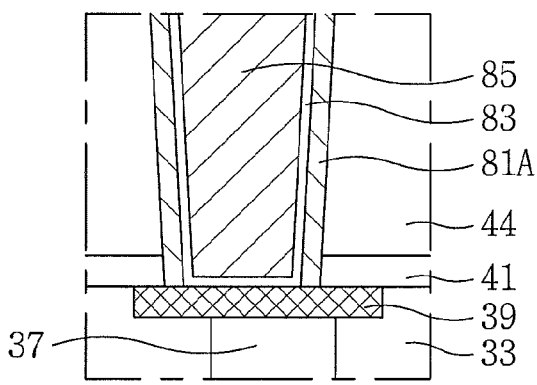

Referring to FIG. 20, the lower electrode 81A may be in contact with a side surface of the etch-stop layer 41 and a side surface of the first molding layer 44. The capacitor dielectric layer 83 may be in contact with an upper surface of the landing pad 39.

Figure 21:
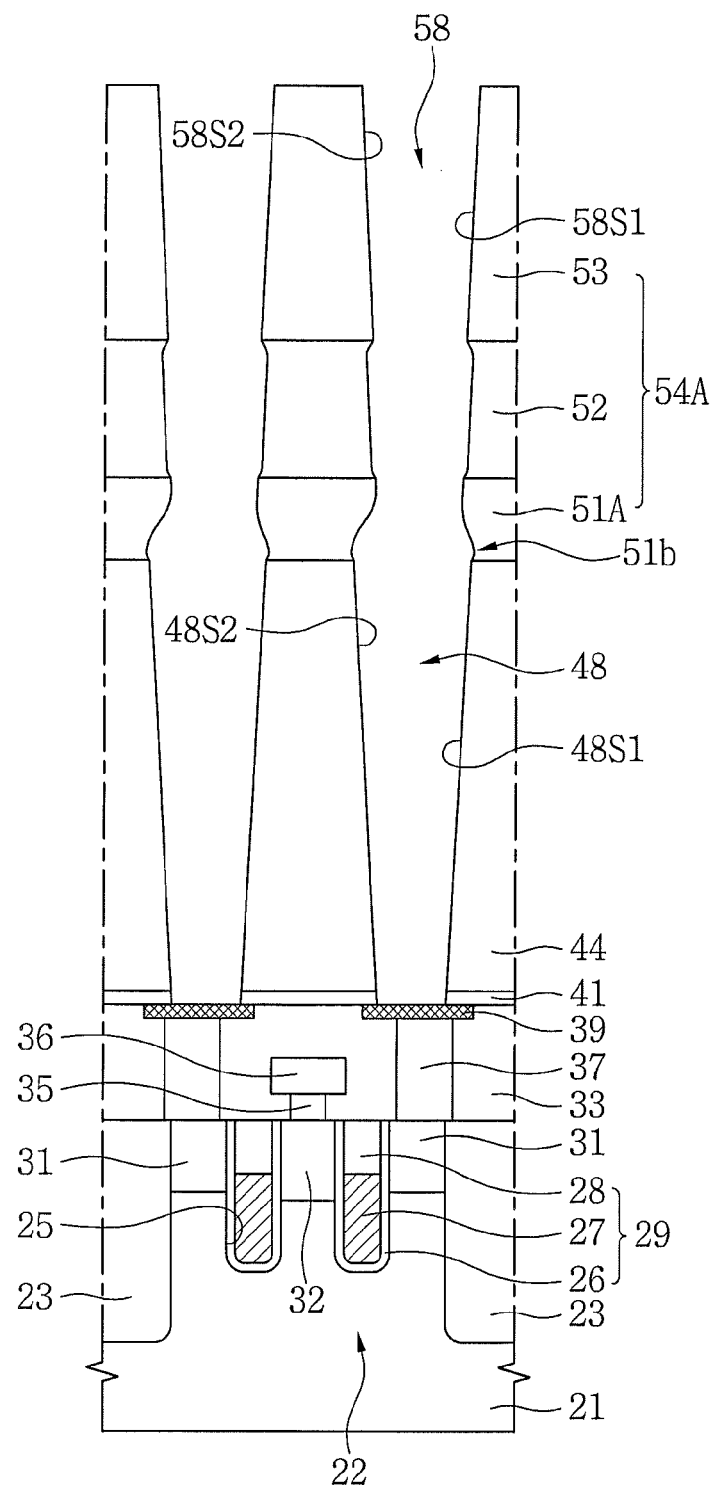
FIGS. 21 and 23 are cross-sectional views illustrating methods of forming semiconductor devices in accordance with embodiments of the inventive concept.
Figure 22:
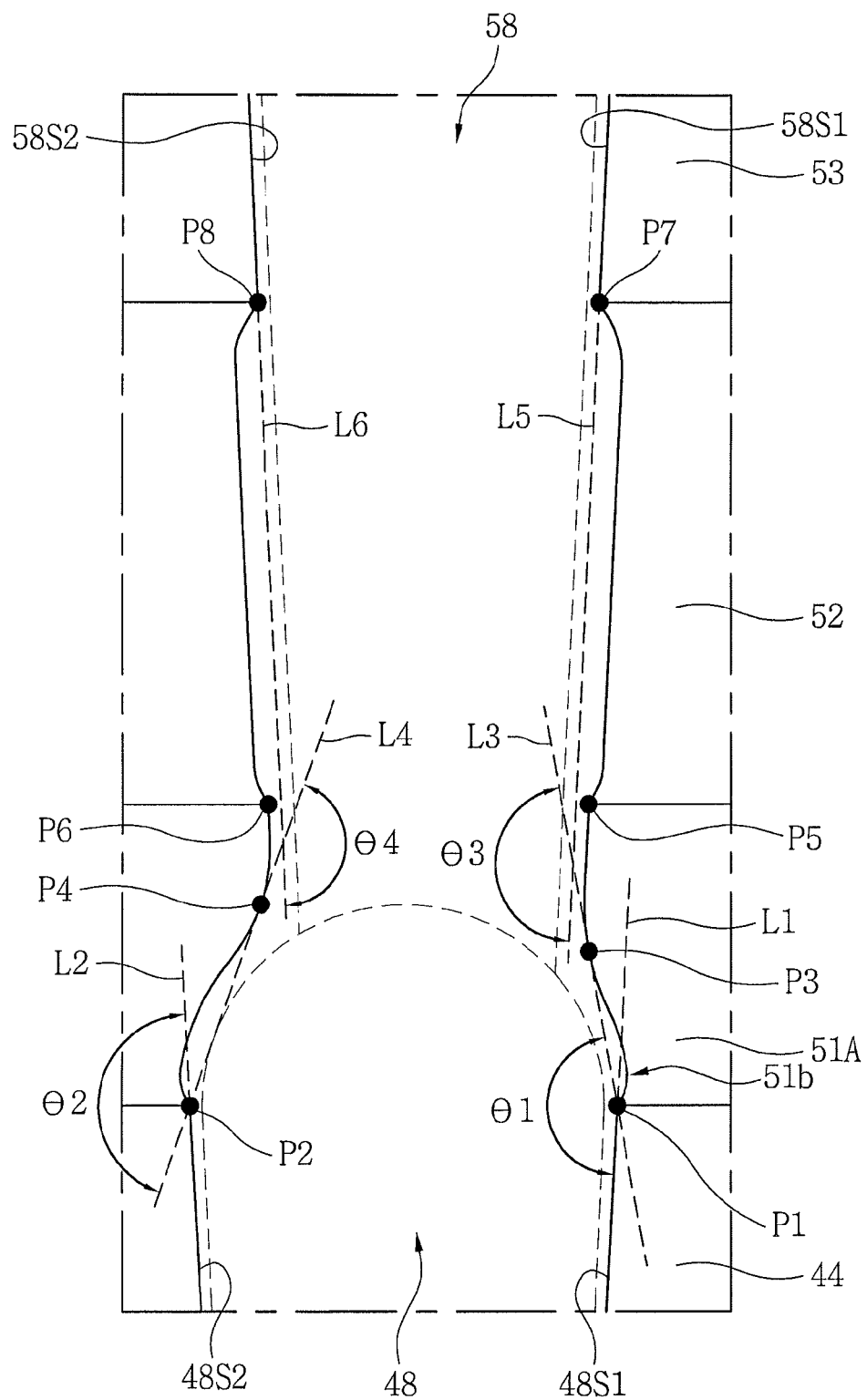
FIG. 22 is an enlarged view showing a part of FIG. 21 in more detail.
Figure 23:
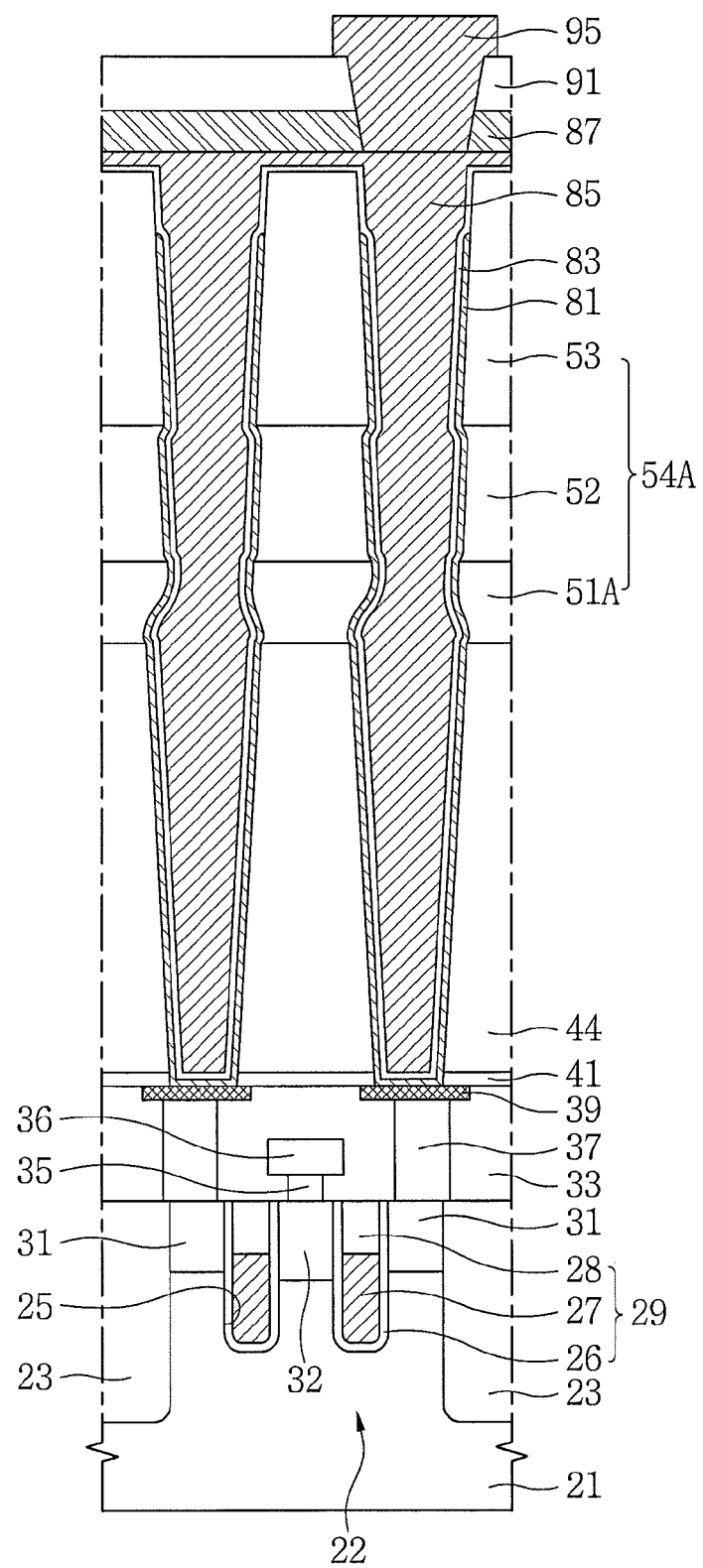
Figure 24:
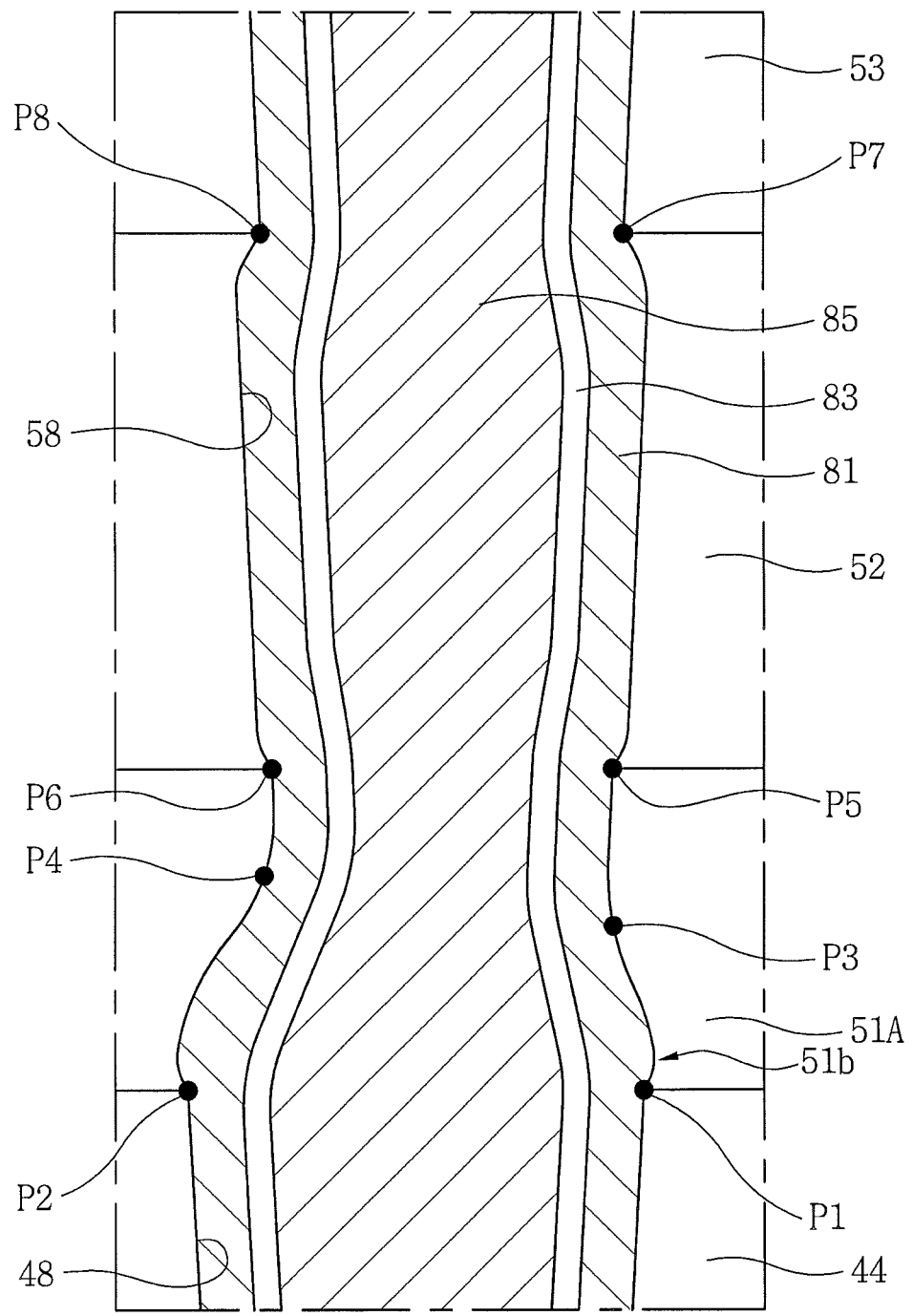
FIG. 24 is an enlarged view showing a part of FIG. 23 in more detail.

FIGS. 21 and 23 are cross-sectional views for describing methods of forming semiconductor devices in accordance with embodiments of the inventive concept. FIG. 22 is an enlarged view showing a part of FIG. 21 in more detail, and FIG. 24 is an enlarged view showing a part of FIG. 23 in more detail.

Referring to FIG. 21, a second molding layer 54A may include a lower molding layer 51A, a middle molding layer 52, and an upper molding layer 53. The lower molding layer 51A may include a material having a higher etch rate than a first molding layer 44. The middle molding layer 52 may include a material having a higher etch rate than the lower molding layer 51A and the upper molding layer 53. Second holes 58 that are connected with first holes 48 through the second molding layer 54A may be formed.

Referring to FIG. 22, each of a first intersection angle (θ1), a second intersection angle (θ2), a third intersection angle (θ3), and a fourth intersection angle (θ4) may be an obtuse angle.

Referring to FIG. 23, a lower electrode 81 may be formed in the first holes 48 and the second holes 58. A capacitor dielectric layer 83 may be formed on the lower electrode 81. An upper electrode 85 may be formed on the capacitor dielectric layer 83. A conductive layer 87 may be formed on the upper electrode 85. An upper insulating layer 91 may be formed on the conductive layer 87. An interconnection 95 may be formed to extend outside the second holes 58 onto an upper surface of the upper insulating layer 91 and to electrically connect to the upper electrode 85.

Referring to FIG. 24, a contact area of the first hole 48 and the second hole 58 may have a gentle slope. The lower electrode 81 and the capacitor dielectric layer 83 may uniformly and closely conformally cover sidewalls of the first holes 48 and the second holes 58.

Figure 25:
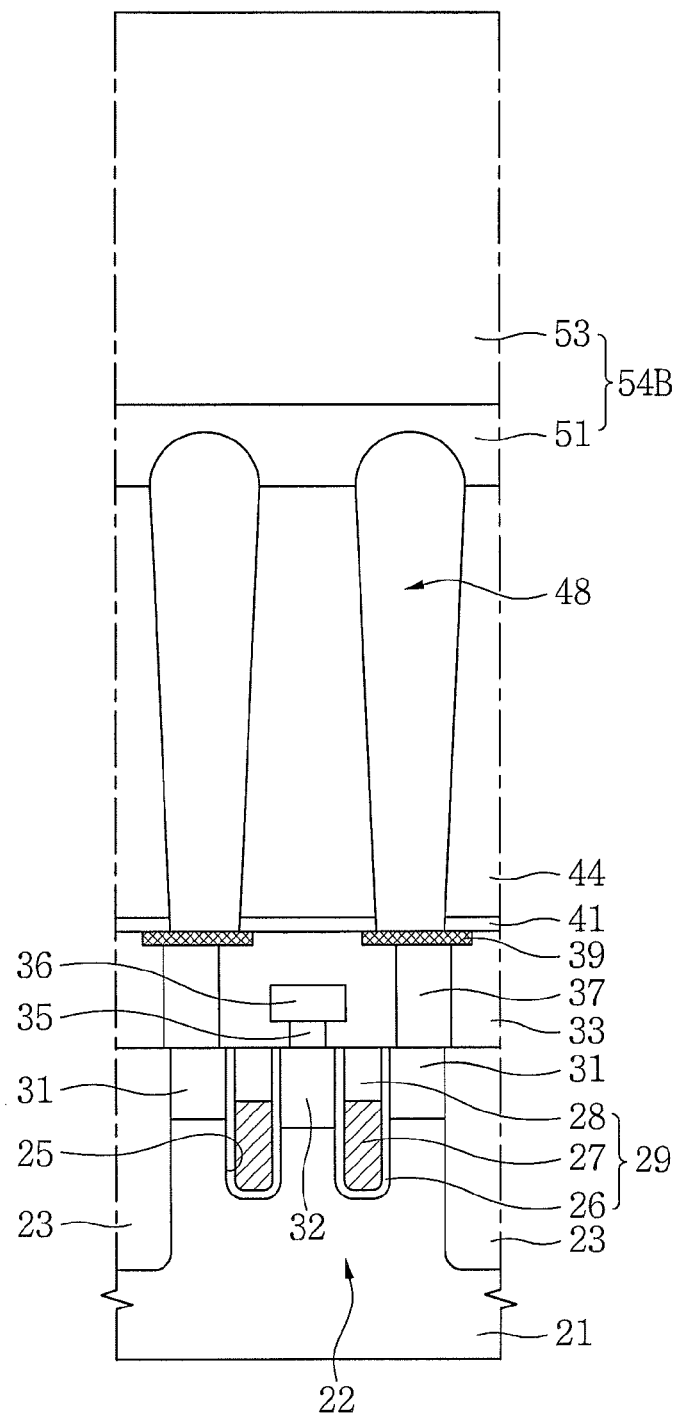
FIGS. 25, 26 and 28 are cross-sectional views illustrating methods of forming semiconductor devices in accordance with embodiments of the inventive concept.
Figure 26:
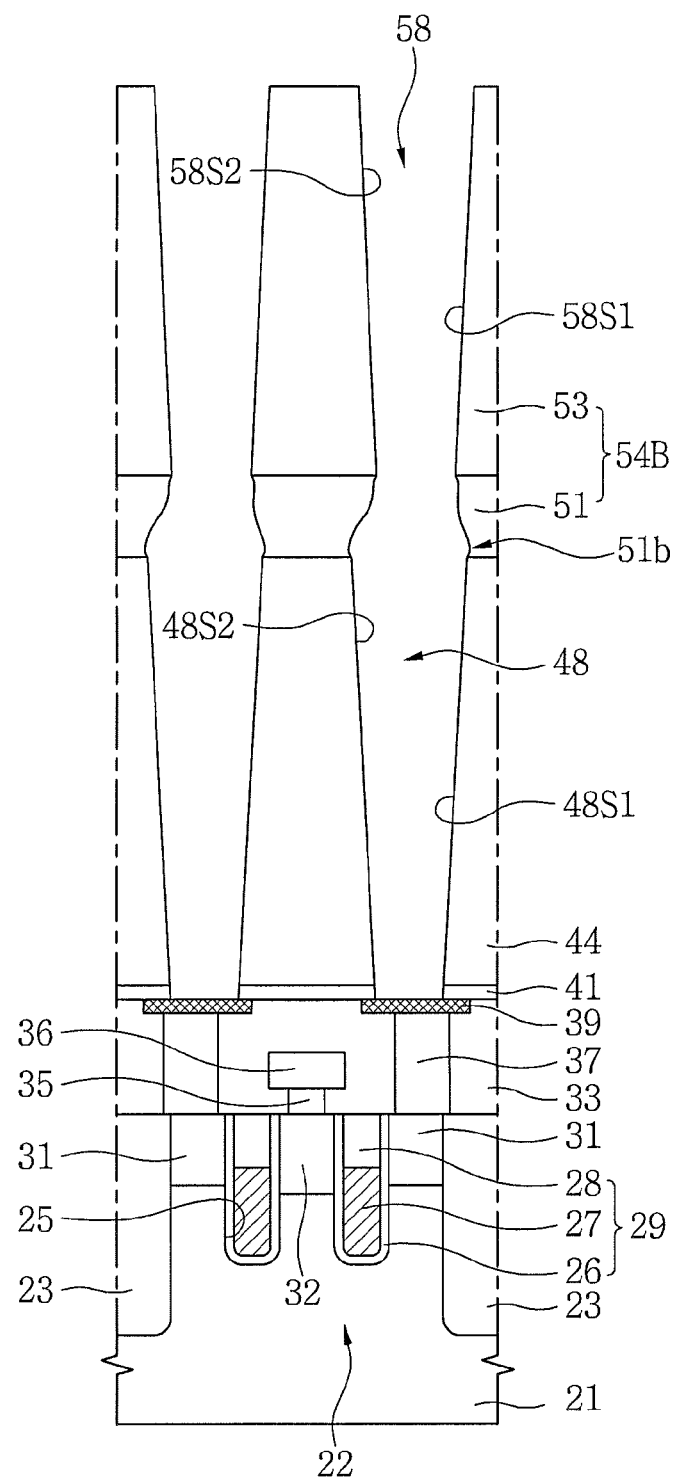
Figure 27:
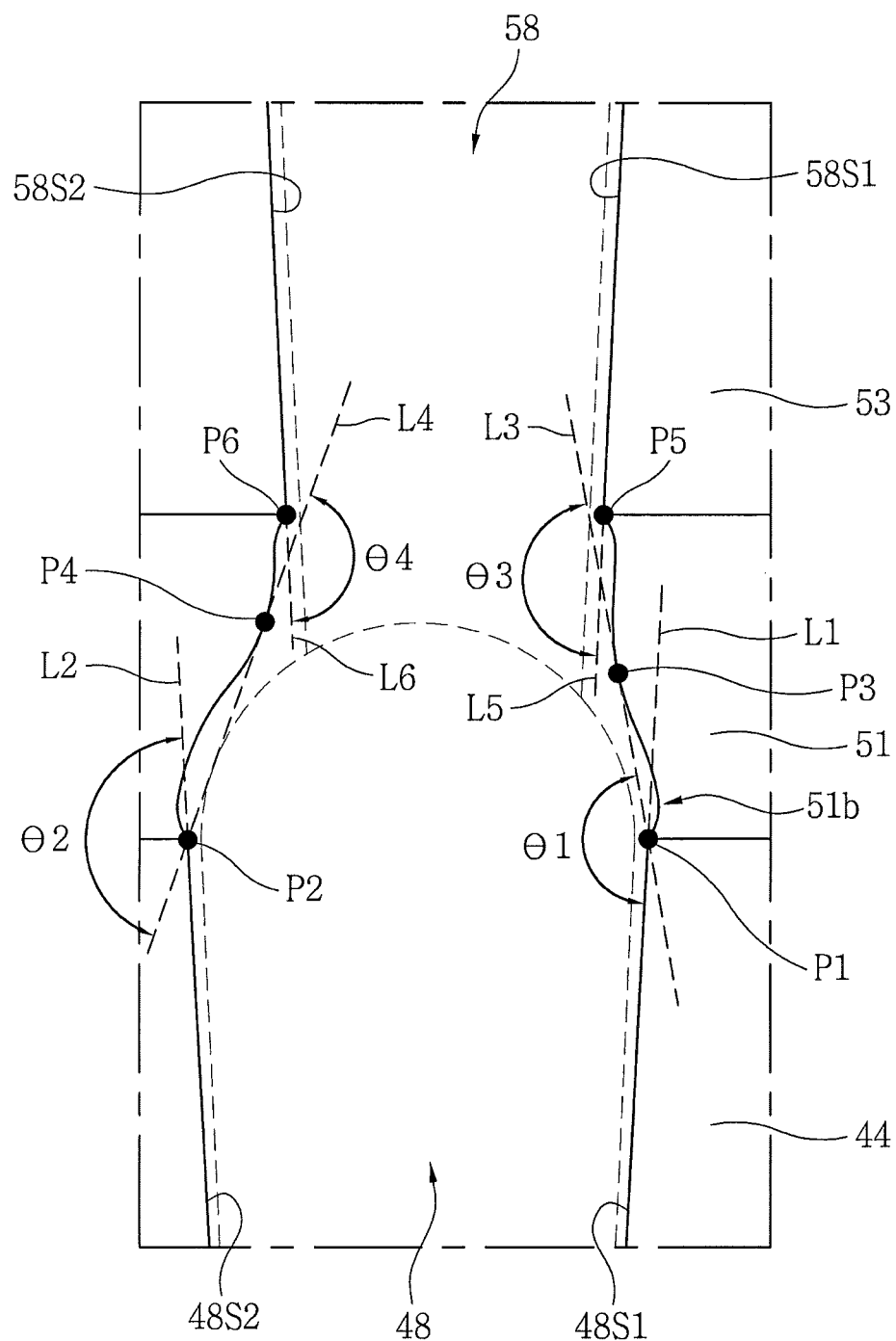
FIG. 27 is an enlarged view showing a part of FIG. 26 in more detail.
Figure 28:
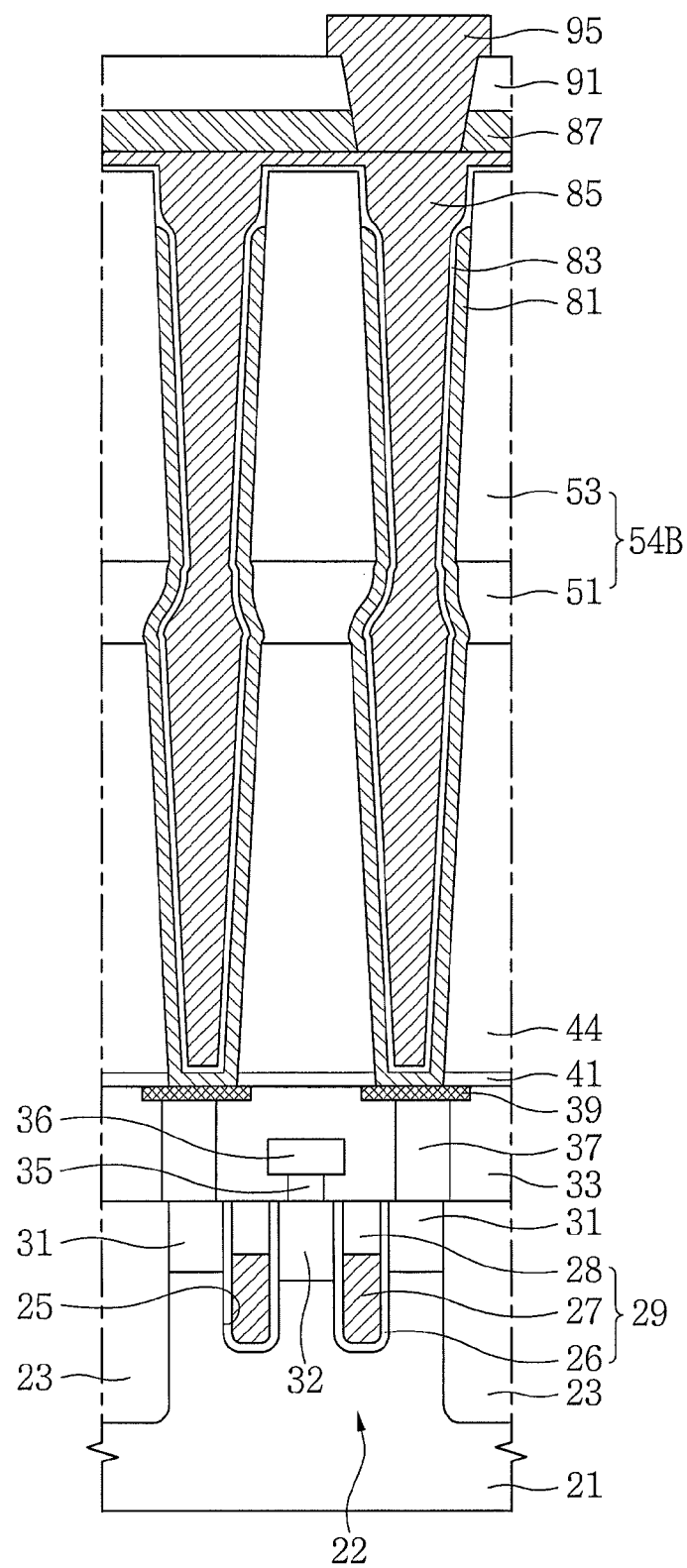
Figure 29:
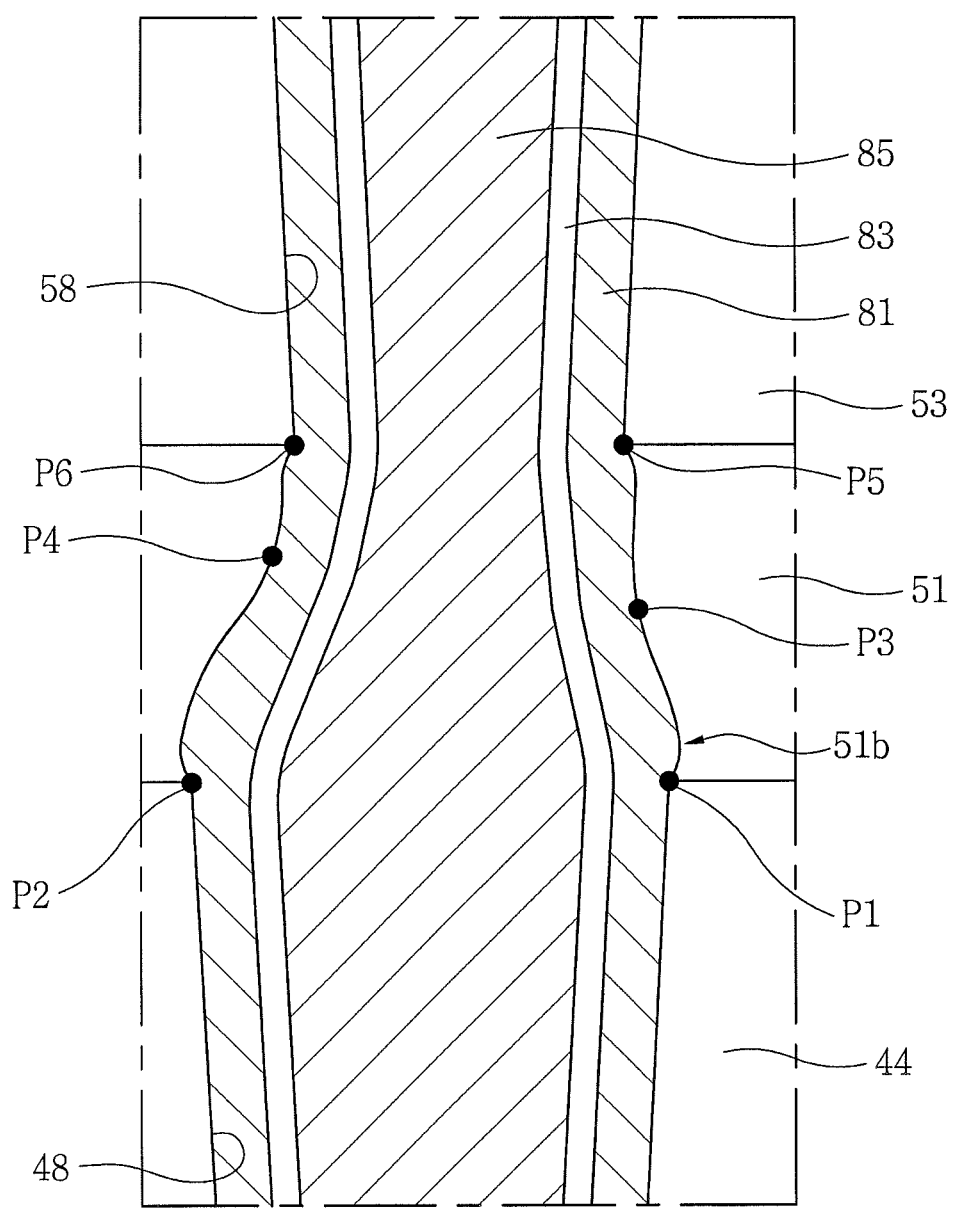
FIG. 29 is an enlarged view showing a part of FIG. 28 in more detail.

FIGS. 25, 26 and 28 are cross-sectional views illustrating methods of forming semiconductor devices in accordance with embodiments of the inventive concept. FIG. 27 is an enlarged view showing a part of FIG. 26 in more detail, and FIG. 29 is an enlarged view showing a part of FIG. 28 in more detail.

Referring to FIG. 25, a second molding layer 54B may be formed on a first molding layer 44 having first holes 48. The second molding layer 54B may include a lower molding layer 51 and an upper molding layer 53. The second molding layer 54B may cover the first holes 48. The first holes 48 may be retained in the first molding layer 44. The second molding layer 54B may include an insulating layer such as silicon oxide, silicon nitride, silicon oxynitride or a combination thereof.

The lower molding layer 51 may be formed between the first molding layer 44 and the upper molding layer 53. The lower molding layer 51 may be in contact with the first molding layer 44. The lower molding layer 51 may be a low conformal layer. The lower molding layer 51 may be formed using a high rate deposition technique. For example, the lower molding layer 51 may be formed at a higher deposition rate than the first molding layer 44 using a CVD technique. The lower molding layer 51 may have a higher etch rate than the first molding layer 44. The lower molding layer 51 may include TEOS.

A thickness of the lower molding layer 51 may be 0.5 to 2 times a horizontal width of the first hole 48. For example, the thickness of the lower molding layer 51 may be similar to the horizontal width of the first hole 48. The lower molding layer 51 may have a thickness of about 50 nm. The first holes 48 may be covered with the lower molding layer 51, and the first holes 48 may be retained in the first molding layer 44.

In some embodiments, the lower molding layer 51 may partially penetrate through an upper end area of the first holes 48.

The upper molding layer 53 may cover the lower molding layer 51. The upper molding layer 53 may be thicker than the lower molding layer 51. The upper molding layer 53 may have a lower etch rate than the lower molding layer 51. For example, the upper molding layer 53 may include an HDP oxide.

Referring to FIG. 26, second holes 58 may be formed to connect with the first holes 48 through the second molding layer 54B. A photolithography process and an etching process may be applied when the second holes 58 are formed. Due to the alignment error of the photolithography process, centers of the second holes 58 may deviate from centers of the first holes 48. For example, straight lines passing through the centers of the second holes 58 and perpendicular to the substrate 21 may slightly deviate from straight lines passing through the centers of the first holes 48 and perpendicular to the substrate 21.

A first right sidewall 48S1, a second right sidewall 58S1, a first left sidewall 48S2, and a second left sidewall 58S2 may be formed. The first hole 48 may include the first right sidewall 48S1 and the first left sidewall 48S2. The second hole 58 may include the second right sidewall 58S1 and the second left sidewall 58S2.

Referring to FIG. 27, an anisotropic etching process and an isotropic etching process may be applied to form the second holes 58. The first holes 48 may be extended while the second holes 58 are formed. The lower molding layer 51 may include a material having a higher etch rate than the first molding layer 44. The upper molding layer 53 may include a material having a lower etch rate than the lower molding layer 51.

First to sixth points P1, P2, P3, P4, P5, and P6 may be formed. The first point P1 may be defined at an intersection of the first right sidewall 48S1 and the second right sidewall 58S1. The second point P2 may be defined at an intersection of the first left sidewall 48S2 and the second left sidewall 58S2. The first point P1 and the second point P2 may be located at a boundary of the first molding layer 44 and the lower molding layer 51. Each of the first point P1 and the second point P2 may correspond to an inflection point.

The third point P3 may be located on the second right sidewall 58S1, located on the lower molding layer 51, at a higher level than the first point P1. The fourth point P4 may be located on the second left sidewall 58S2, of lower molding layer 51, and at a higher level than the second point P2. Each of the third point P3 and the fourth point P4 may correspond to an inflection point.

The fifth point P5 may be located on the second right sidewall 58S1, located at a boundary of the lower molding layer 51 and the upper molding layer 53, at a higher level than the third point P3. The sixth point P6 may be located on the second left sidewall 58S2, at a boundary of the lower molding layer 51 and the upper molding layer 53, at a higher level than the fourth point P4. Each of the fifth point P5 and the sixth point P6 may correspond to an inflection point.

First to sixth straight lines L1, L2, L3, L4, L5, and L6 may be defined. The first straight line L1 may be defined as a straight line which is parallel to the first right sidewall 48S1 in the first molding layer 44 and passes through the first point P1. The second straight line L2 may be defined as a straight line which is parallel to the first left sidewall 48S2 in the first molding layer 44 and passes through the second point P2. The third straight line L3 may be defined as a straight line passing through the first point P1 and the third point P3. The fourth straight line L4 may be defined as a straight line passing through the second point P2 and the fourth point P4. The fifth straight line L5 may be defined as a straight line which is parallel to the second right sidewall 58S1 in the lower molding layer 51 and passes through the fifth point P5. The sixth straight line L6 may be defined as a straight line which is parallel to the second left sidewall 58S2 in the lower molding layer 51 and passes through the sixth point P6.

The first straight line L1 and the third straight line L3 may have a first intersection angle (θ1). The second straight line L2 and the fourth straight line L4 may have a second intersection angle (θ2). The third straight line L3 and the fifth straight line L5 may have a third intersection angle (θ3). The fourth straight line L4 and the sixth straight line L6 may have a fourth intersection angle (θ4).

The second right sidewall 58S1 may be in contact with the first right sidewall 48S1. A contact area between the second right sidewall 58S1 and the first right sidewall 48S1 may have a gentle slope. Each of the first intersection angle (θ1) and the third intersection angle (θ3) may be an obtuse angle. The second left sidewall 58S2 may be in contact with the first left sidewall 48S2. A contact area between the second left sidewall 58S2 and the first left sidewall 48S2 may have a gentle slope. Each of the second intersection angle (θ2) and the fourth intersection angle (θ4) may be an obtuse angle. The first intersection angle (θ1), the second intersection angle (θ2), the third intersection angle (θ3), and the fourth intersection angle (θ4) may be 150° to 179°.

The second right sidewall 58S1 and the second left sidewall 58S2 may have different profiles from each other. The second right sidewall 58S1 and the second left sidewall 58S2 may be sloped at different angles. The third point P3 and the fourth point P4 may be formed at different vertical levels from each other. The fourth point P4 may be formed at a higher level than the third point P3. The first intersection angle (θ1) may be different from the second intersection angle (θ2). The third intersection angle (θ3) may be different from the fourth intersection angle (θ4).

Referring to FIG. 28, a lower electrode 81 may be formed in the first holes 48 and the second holes 58. A capacitor dielectric layer 83 may be formed on the lower electrode 81. An upper electrode 85 may be formed on the capacitor dielectric layer 83. A conductive layer 87 may be formed on the upper electrode 85. An upper insulating layer 91 may be formed on the conductive layer 87. An interconnection 95 may be formed to extend outside the second holes 58 and an upper surface of the upper insulating layer 91 and may connect to the upper electrode 85.

Referring to FIG. 29, a contact area of the first hole 48 and the second hole 58 may have a gentle slope. The lower electrode 81 and the capacitor dielectric layer 83 may uniformly and closely conformally cover sidewalls of the first holes 48 and the second holes 58

Figure 30:
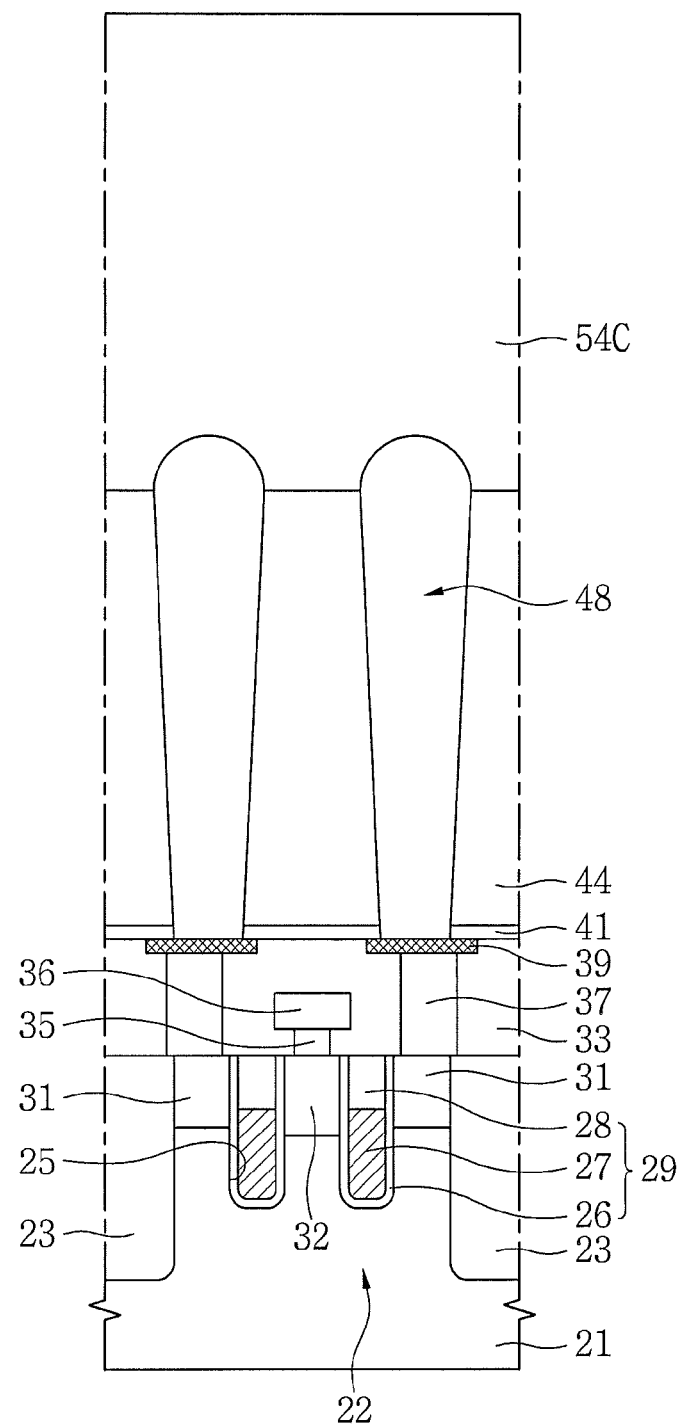
FIGS. 30, 31 and 33 are cross-sectional views illustrating methods of forming semiconductor devices in accordance with embodiments of the inventive concept.
Figure 31:
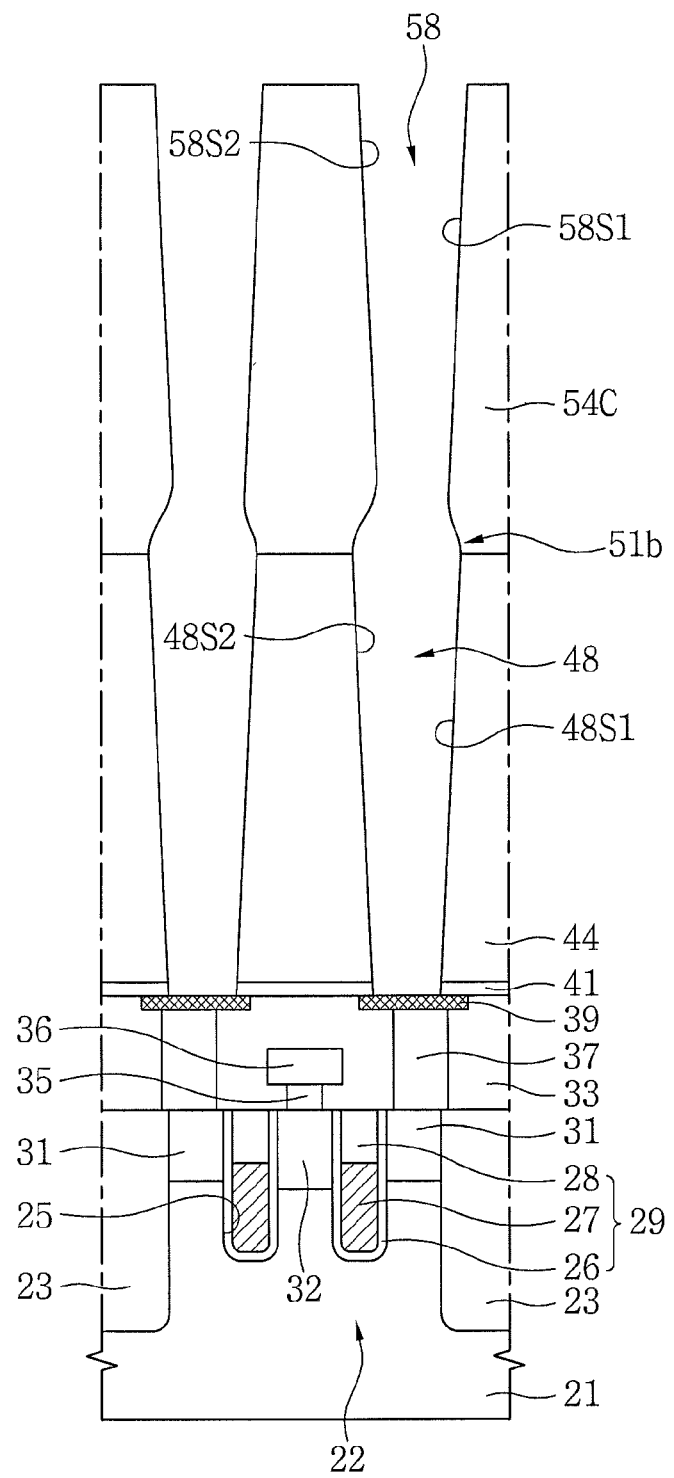
Figure 32:
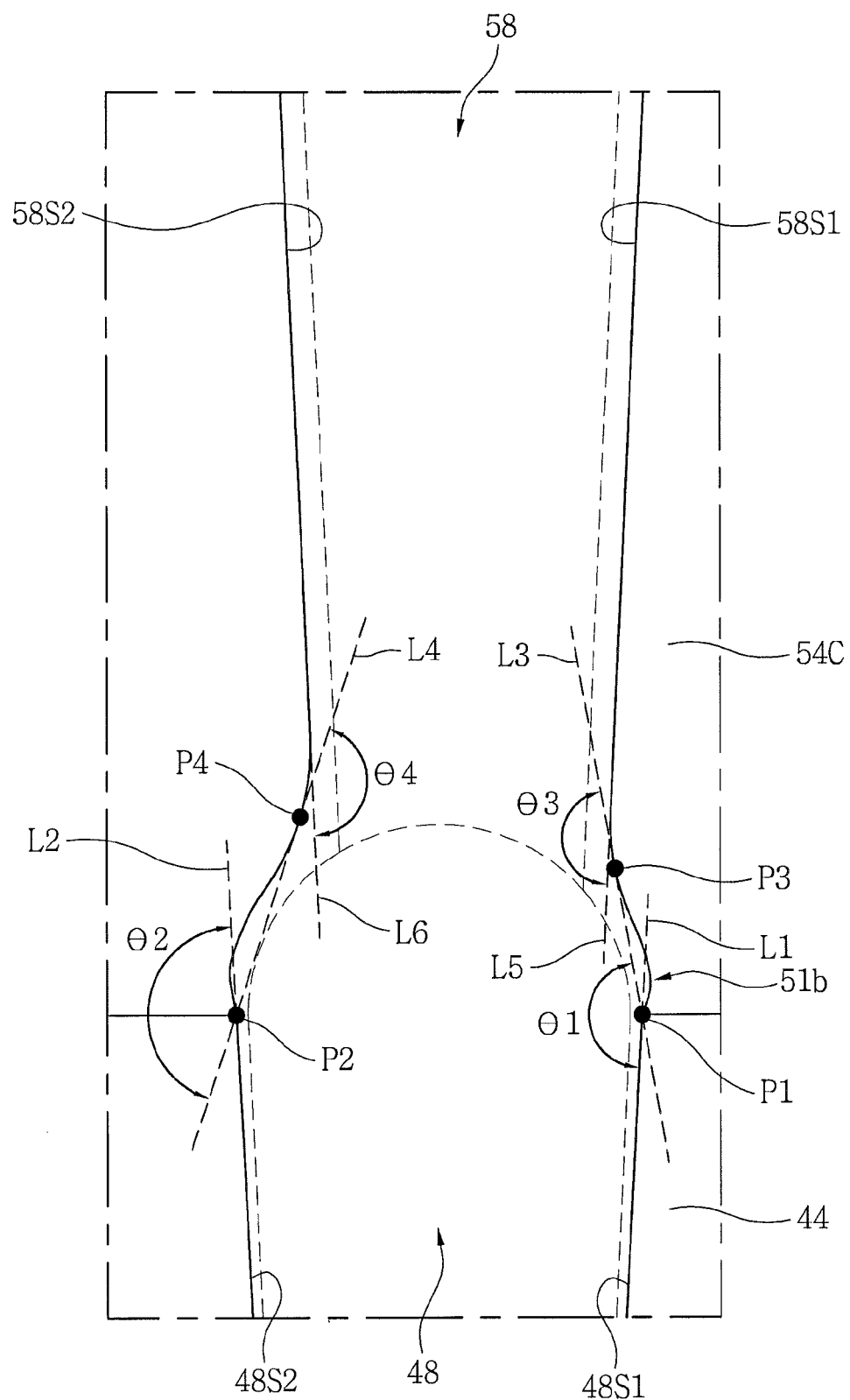
FIG. 32 is an enlarged view showing a part of FIG. 31 in more detail.
Figure 33:
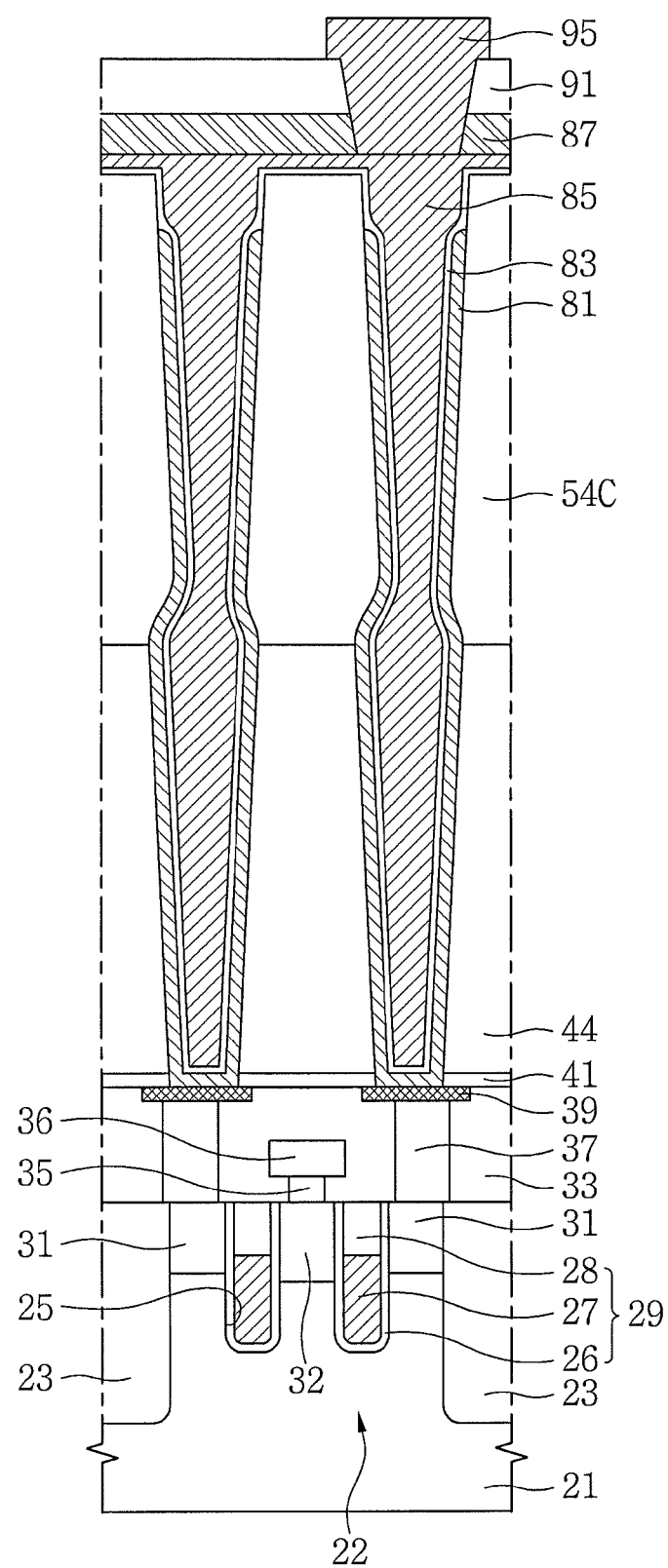
Figure 34:
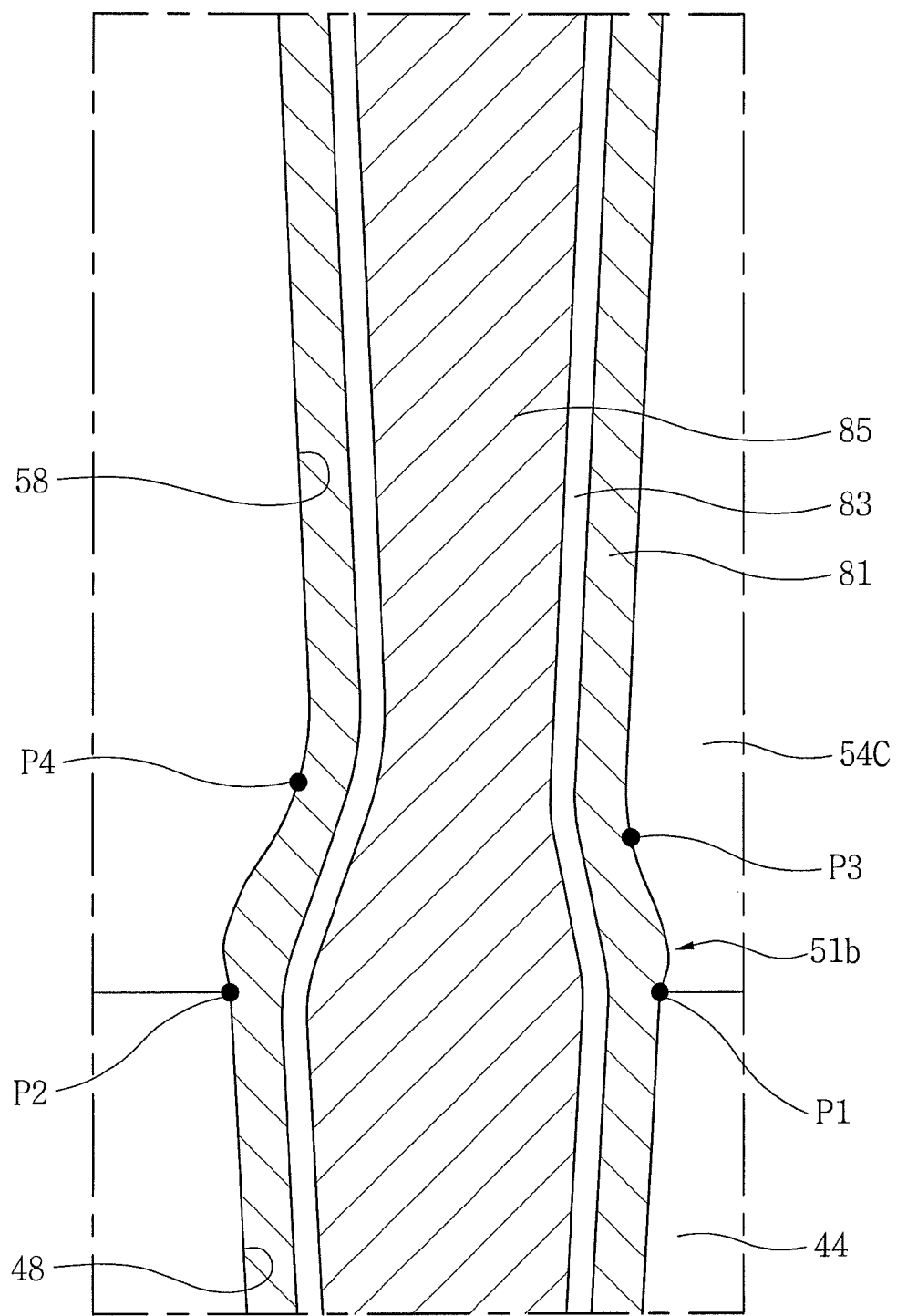
FIG. 34 is an enlarged view showing a part of FIG. 33 in more detail.

FIGS. 30, 31 and 33 are cross-sectional views for describing methods of forming semiconductor devices in accordance with embodiments of the inventive concept. FIG. 32 is an enlarged view showing a part of FIG. 31 in more detail, and FIG. 34 is an enlarged view showing a part of FIG. 33 in more detail.

Referring to FIG. 30, a second molding layer 54C may be formed on a first molding layer 44 having first holes 48. The second molding layer 54C may cover the first holes 48. The first holes 48 may be retained in the first molding layer 44.

The second molding layer 54C may include an insulating layer such as silicon oxide, silicon nitride, silicon oxynitride or a combination thereof.

The second molding layer 54C may be in contact with the first molding layer 44. The second molding layer 54C may be a low conformal layer. The second molding layer 54C may be formed using a high rate deposition technique. For example, the second molding layer 54C may be formed at a higher deposition rate than the first molding layer 44 using a CVD technique. The second molding layer 54C may have a higher etch rate than the first molding layer 44. The second molding layer 54C may include TEOS.

In some embodiments, the second molding layer 54C may partially penetrate through an upper end area of the first holes 48.

Referring to FIG. 31, second holes 58 connect with the first holes 48 through the second molding layer 54C. A photolithography process and an etching process may be applied when the second holes 58 are formed. Due to the alignment error of the photolithography process, centers of the second holes 58 may deviate from centers of the first holes 48. For example, straight lines passing through the centers of the second holes 58 and perpendicular to the substrate 21 may slightly deviate from straight lines passing through the centers of the first holes 48 and perpendicular to the substrate 21.

A first right sidewall 48S1, a second right sidewall 58S1, a first left sidewall 48S2, and a second left sidewall 58S2 may be formed. The first hole 48 may include the first right sidewall 48S1 and the first left sidewall 48S2. The second hole 58 may include the second right sidewall 58S1 and the second left sidewall 58S2.

Referring to FIG. 32, an anisotropic etching process and an isotropic etching process may be applied when the second holes 58 are formed. The first holes 48 may be extended while the second holes 58 are formed. The second molding layer 54C may include a material having a higher etch rate than the first molding layer 44.

First to fourth points P1, P2, P3, and P4 may be defined. The first point P1 may be defined at an intersection of the first right sidewall 48S1 and the second right sidewall 58S1. The second point P2 may be defined at an intersection of the first left sidewall 48S2 and the second left sidewall 58S2. The first point P1 and the second point P2 may be located at a boundary of the first molding layer 44 and the second molding layer 54C. Each of the first point P1 and the second point P2 may correspond to an inflection point.

The third point P3 may be located on the second right sidewall 58S1, located on the second molding layer 54C, and at a higher level than the first point P1. The fourth point P4 may be located on the second left sidewall 58S2, located on the second molding layer 54C, and defined at a higher level than the second point P2. Each of the third point P3 and the fourth point P4 may correspond to an inflection point.

First to sixth straight lines L1, L2, L3, L4, L5, and L6 may be defined. The first straight line L1 may be defined as a straight line which is parallel to the first right sidewall 48S1 and passes through the first point P1. The second straight line L2 may be defined as a straight line which is parallel to the first left sidewall 48S2 and passes through the second point P2. The third straight line L3 may be defined as a straight line passing through the first point P1 and the third point P3. The fourth straight line L4 may be defined as a straight line passing through the second point P2 and the fourth point P4. The fifth straight line L5 may be defined as a tangent line to the second right sidewall 58S1. The sixth straight line L6 may be defined as a tangent line to the second left sidewall 58S2.

The first straight line L1 and the third straight line L3 may have a first intersection angle (θ1). The second straight line L2 and the fourth straight line L4 may have a second intersection angle (θ2). The third straight line L3 and the fifth straight line L5 may have a third intersection angle (θ3). The fourth straight line L4 and the sixth straight line L6 may have a fourth intersection angle (θ4).

The second right sidewall 58S1 may be in contact with the first right sidewall 48S1. A contact area between the second right sidewall 58S1 and the first right sidewall 48S1 may have a gentle slope. Each of the first intersection angle (θ1) and the third intersection angle (θ3) may be an obtuse angle. The second left sidewall 58S2 may be in contact with the first left sidewall 48S2. A contact area between the second left sidewall 58S2 and the first left sidewall 48S2 may have a gentle slope. Each of the second intersection angle (θ2) and the fourth intersection angle (θ4) may be an obtuse angle. Each of the first intersection angle (θ1), the second intersection angle (θ2), the third intersection angle (θ3), and the fourth intersection angle (θ4) may be 150° to 179°.

The second right sidewall 58S1 and the second left sidewall 58S2 may have different profiles from each other. The second right sidewall 58S1 and the second left sidewall 58S2 may have different slopes. The third point P3 and the fourth point P4 may be formed at different vertical levels from each other. The fourth point P4 may be formed higher than the third point P3. The first intersection angle (θ1) may be different from the second intersection angle (θ2). The third intersection angle (θ3) may be different from the fourth intersection angle (θ4).

Referring to FIG. 33, a lower electrode 81 may be formed in the first holes 48 and the second holes 58. A capacitor dielectric layer 83 may be formed on the lower electrode 81. An upper electrode 85 may be formed on the capacitor dielectric layer 83. A conductive layer 87 may be formed on the upper electrode 85. An upper insulating layer 91 may be formed on the conductive layer 87. An interconnection 95 may be formed to cross the upper insulating layer 91 and connected to the upper electrode 85.

Referring to FIG. 34, a contact area of the first hole 48 and the second hole 58 may have a gentle slope. The lower electrode 81 and the capacitor dielectric layer 83 may uniformly and closely conformally cover sidewalls of the first holes 48 and the second holes 58.

Figure 35:
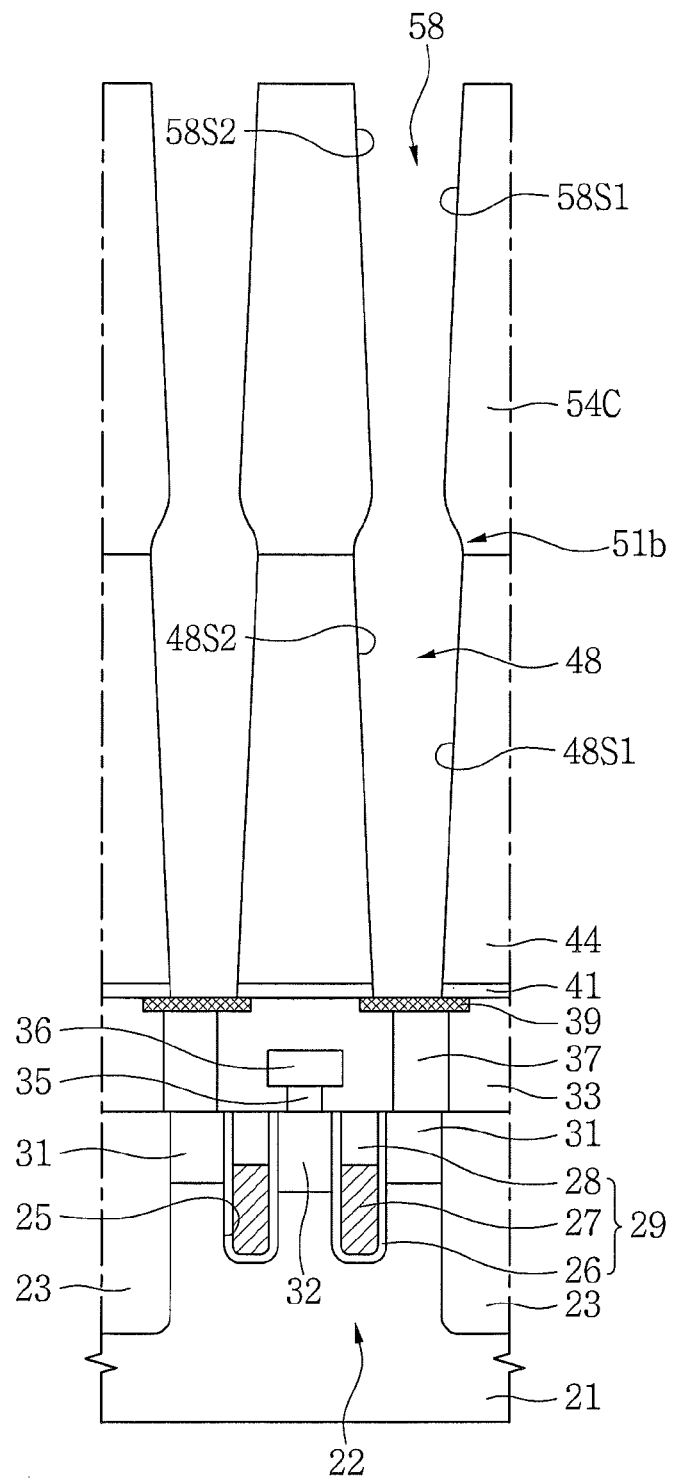
FIGS. 35 and 37 are cross-sectional views illustrating methods of forming semiconductor devices in accordance with embodiments of the inventive concept.
Figure 36:
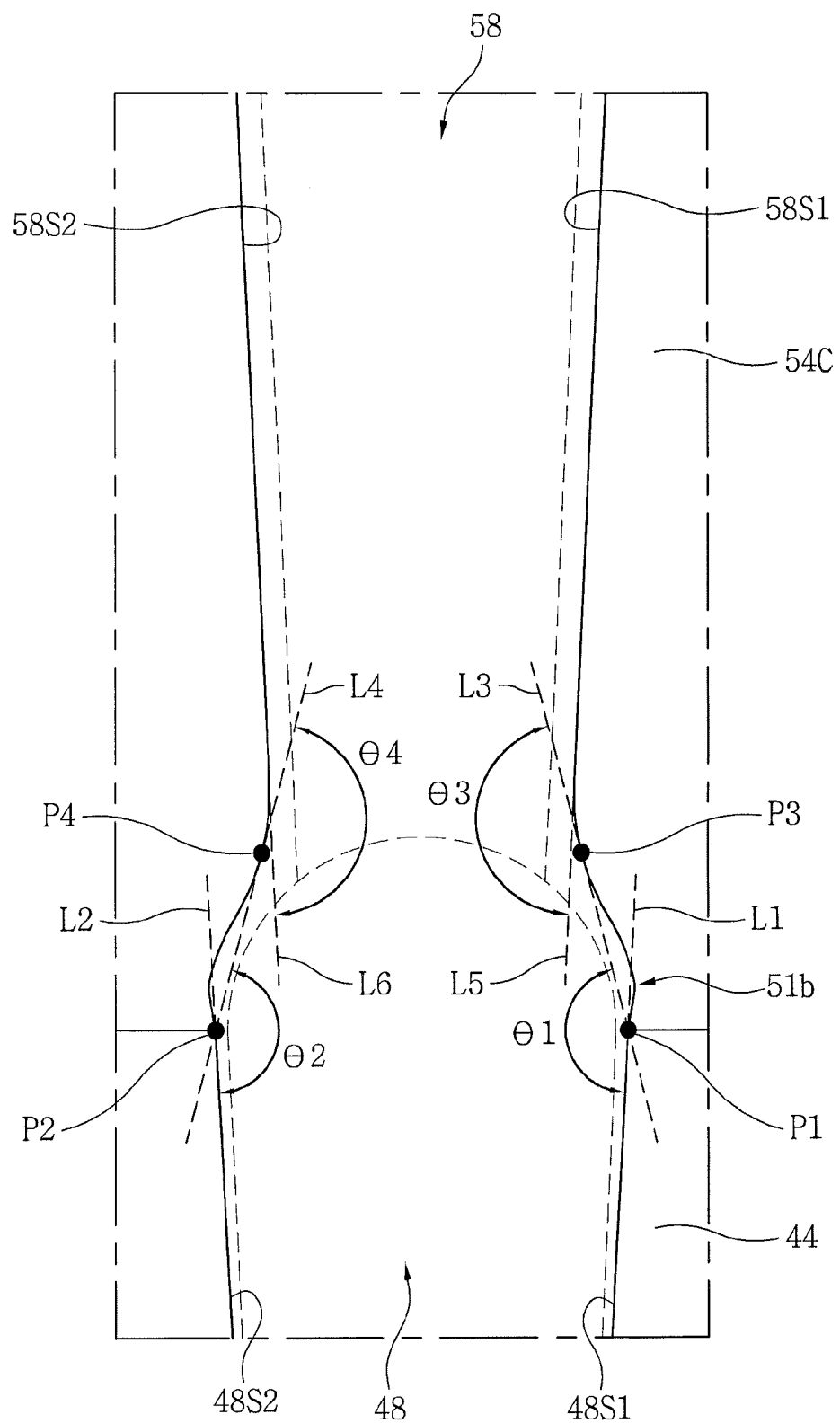
FIG. 36 is an enlarged view showing a part of FIG. 35 in more detail.
Figure 37:
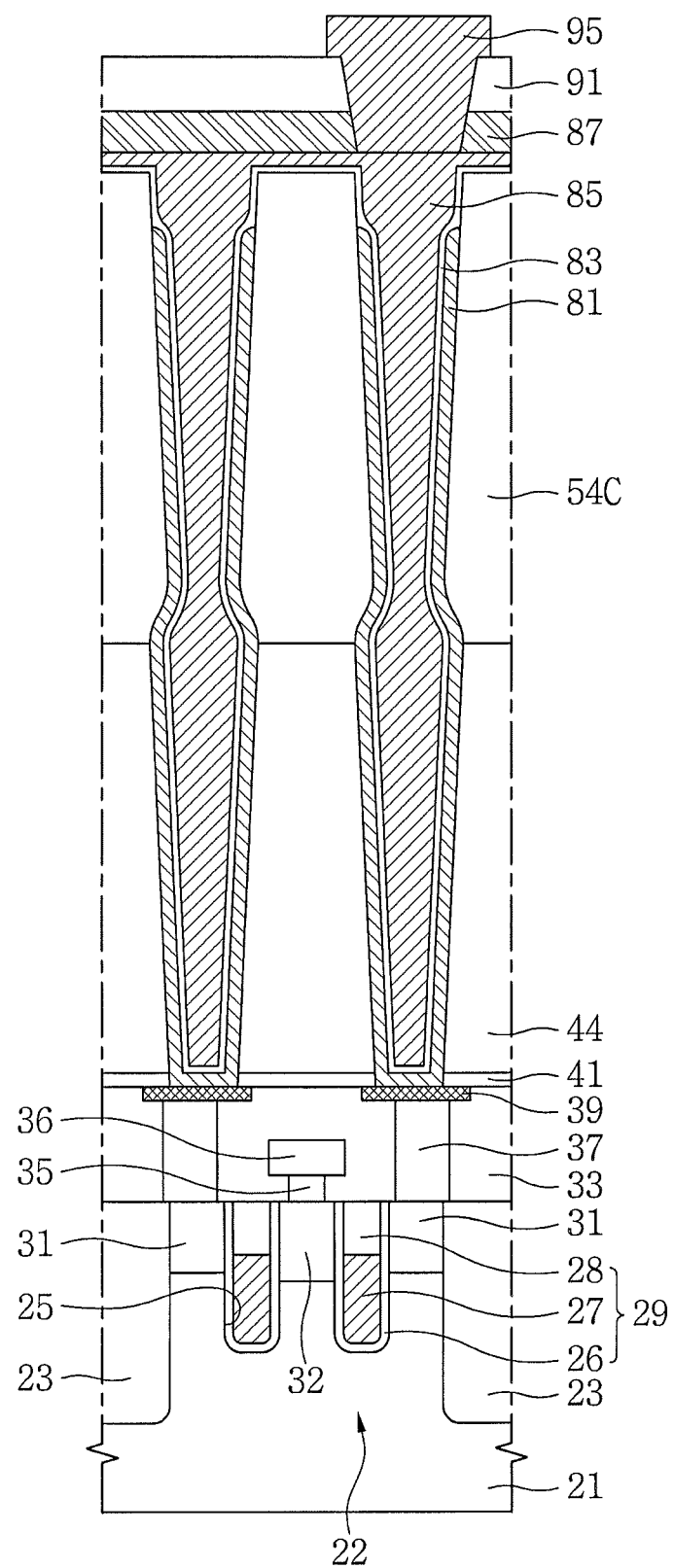
Figure 38:
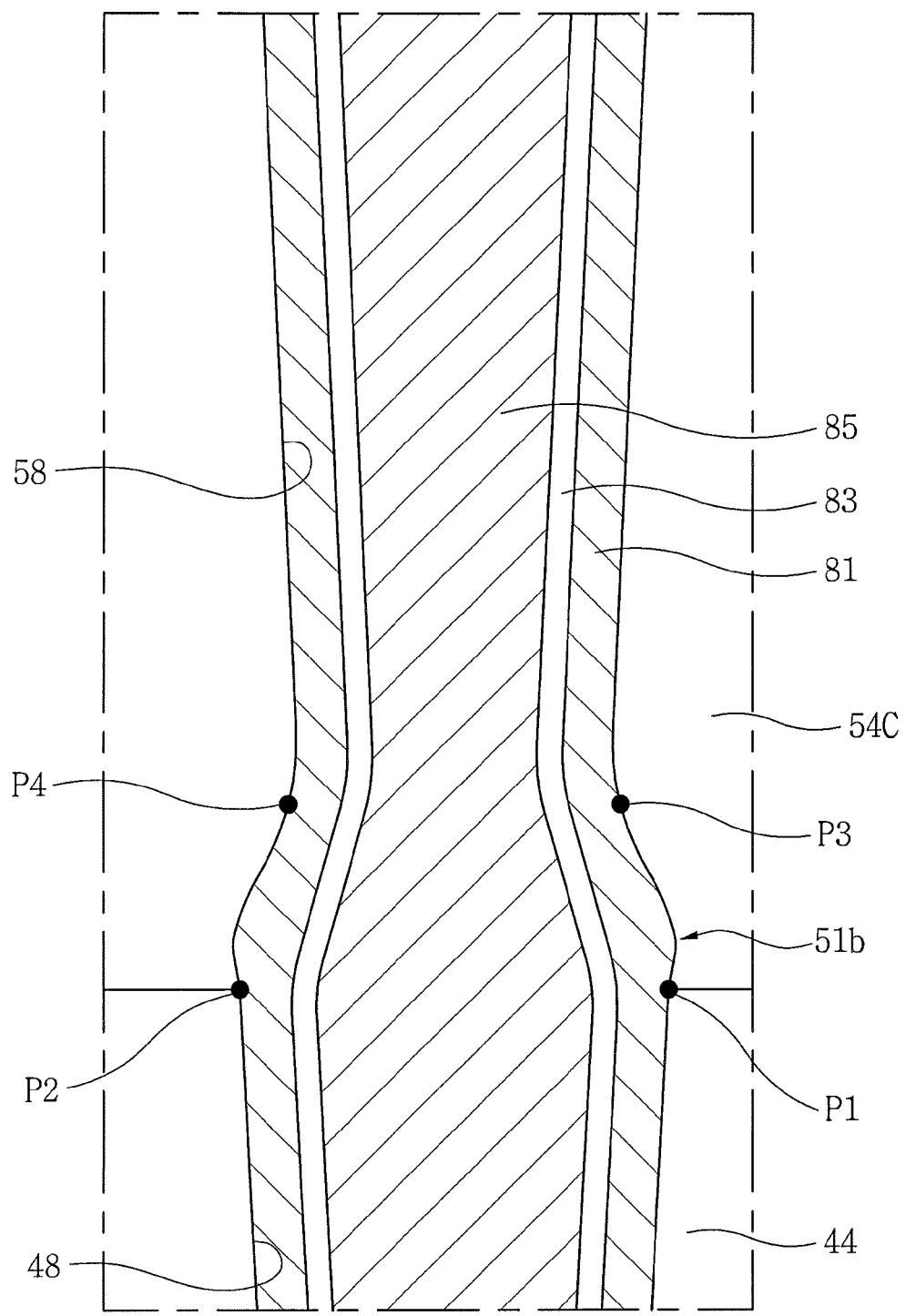
FIG. 38 is an enlarged view showing a part of FIG. 37 in more detail.

FIGS. 35 and 37 are cross-sectional views illustrating methods of forming semiconductor devices in accordance with embodiments of the inventive concept. FIG. 36 is an enlarged view showing a part of FIG. 35 in more detail, and FIG. 38 is an enlarged view showing a part of FIG. 37 in more detail.

Referring to FIG. 35, second holes 58 may be formed to connect with first holes 48 through a second molding layer 54C. A photolithography process and an etching process may be applied when the second holes 58 are formed. A center of the second hole 58 may be vertically aligned with a center of the first hole 48.

A first right sidewall 48S1, a second right sidewall 58S1, a first left sidewall 48S2, and a second left sidewall 58S2 may be formed. The first hole 48 may include the first right sidewall 48S1 and the first left sidewall 48S2. The second hole 58 may include the second right sidewall 58S1 and the second left sidewall 58S2.

Referring to FIG. 36, an anisotropic etching process and an isotropic etching process may be applied to form the second holes 58. The first holes 48 may be extended while the second holes 58 are formed. The second molding layer 54C may include a material having a higher etch rate than the first molding layer 44.

The second right sidewall 58S1 and the second left sidewall 58S2 may have the same profile. The second right sidewall 58S1 and the second left sidewall 58S2 may have the same angle. The third point P3 and the fourth point P4 may be formed at the same vertical level.

Referring to FIG. 37, a lower electrode 81 may be formed in the first holes 48 and the second holes 58. A capacitor dielectric layer 83 may be formed on the lower electrode 81. An upper electrode 85 may be formed on the capacitor dielectric layer 83. A conductive layer 87 may be formed on the upper electrode 85. An upper insulating layer 91 may be formed on the conductive layer 87. An interconnection 95 may be formed to cross the upper insulating layer 91 and connected to the upper electrode 85.

Referring to FIG. 38, a contact area of the first hole 48 and the second hole 58 may have a gentle slope. The lower electrode 81 and the capacitor dielectric layer 83 may uniformly and closely conformally cover sidewalls of the first holes 48 and the second holes 58.

Figure 39:
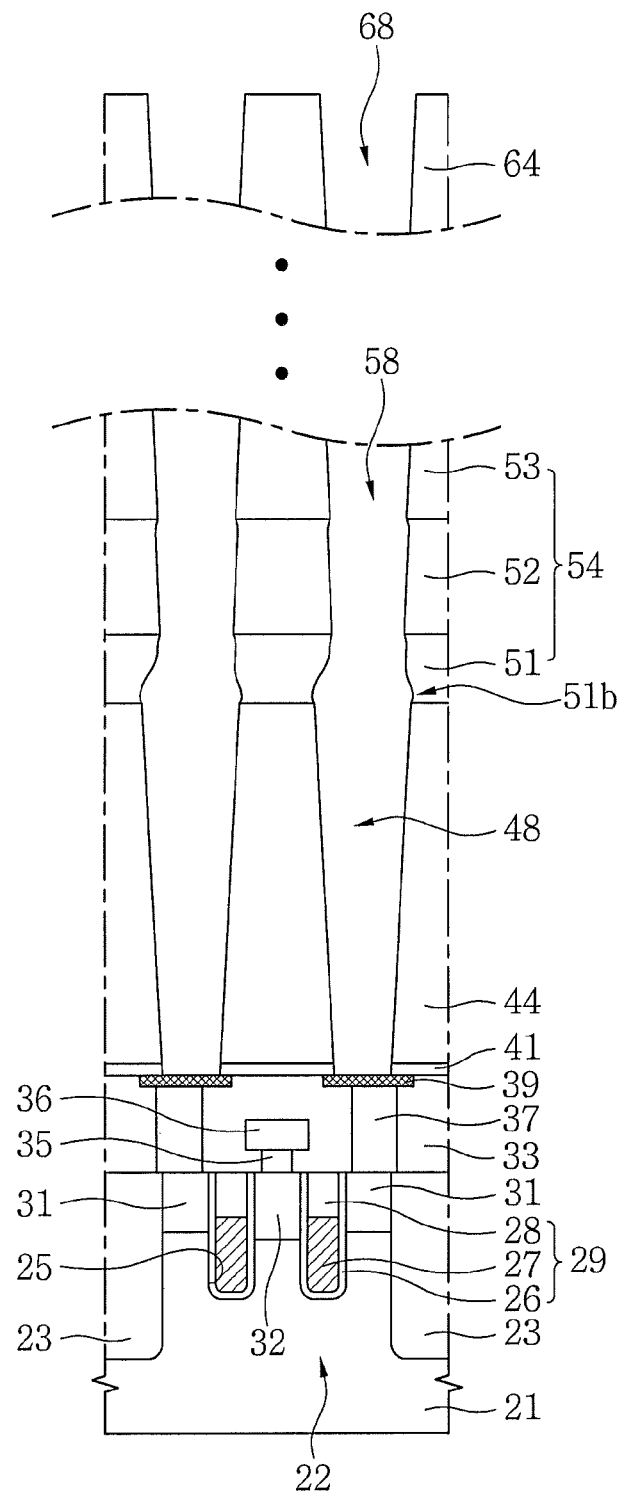
FIGS. 39 and 40 are cross-sectional views illustrating methods of forming semiconductor devices in accordance with embodiments of the inventive concept.
Figure 40:
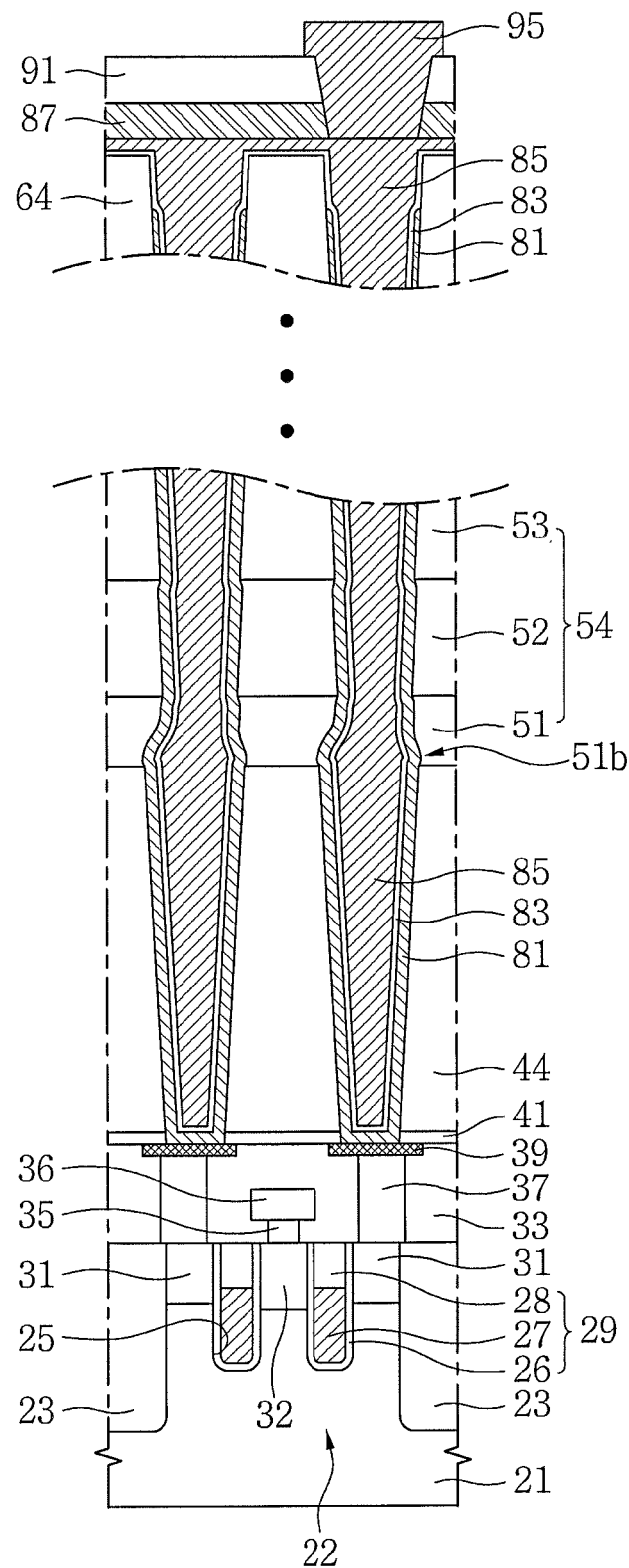

FIGS. 39 and 40 are cross-sectional views illustrating methods of forming semiconductor devices in accordance with embodiments of the inventive concept.

Referring to FIG. 39, a third molding layer 64 may be formed on a second molding layer 54. Third holes 68 may be formed to connect with second holes 58 through the third molding layer 64. The third molding layer 64 and the third holes 68 may be formed in a similar manner to the second molding layer 54 and the second holes 58. The third molding layer 64 and the third holes 68 may have a similar configuration to the second molding layer 54 and the second holes 58.

In some embodiments, a plurality of other molding layers may be formed between the third molding layer 64 and the second molding layer 54. A plurality of other holes may be formed between the third holes 68 and the second holes 58.

Referring to FIG. 40, a lower electrode 81 may be formed in the first holes 48, the second holes 58 and the third holes 68. A capacitor dielectric layer 83 may be formed on the lower electrode 81. An upper electrode 85 may be formed on the capacitor dielectric layer 83. A conductive layer 87 may be formed on the upper electrode 85. An upper insulating layer 91 may be formed on the conductive layer 87. An interconnection 95 may be formed to cross the upper insulating layer 91 and connected to the upper electrode 85.

Figure 41:
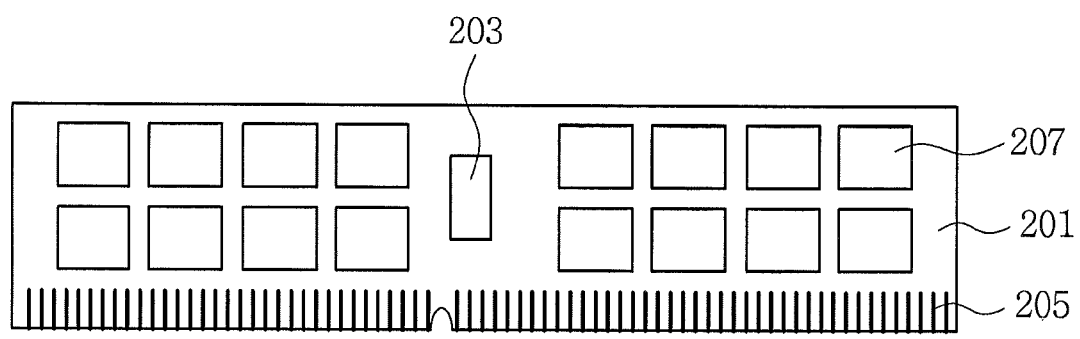
FIG. 41 is a layout illustrating a semiconductor module in accordance with embodiments of the inventive concept.

FIG. 41 is a layout illustrating a semiconductor module in accordance with embodiments of the inventive concept.

Referring to FIG. 41, the semiconductor module in accordance with embodiments of the inventive concept may include a module substrate 201, a plurality of semiconductor packages 207, and a control chip package 203. Input and output terminals 205 may be formed on the module substrate 201. The semiconductor packages 207 may include a similar configuration to that described with reference to FIGS. 1 to 40. The semiconductor packages 207 and the control chip package 203 may be mounted on the module substrate 201. The semiconductor packages 207 and the control chip package 203 may be electrically connected to the input and output terminals 205 in series/parallel.

The control chip package 203 may be omitted. The semiconductor packages 207 may include a dynamic random access memory (DRAM) including capacitors formed according to embodiments described herein. The semiconductor module according to embodiments of the inventive concept may be a memory module.

Figure 42:
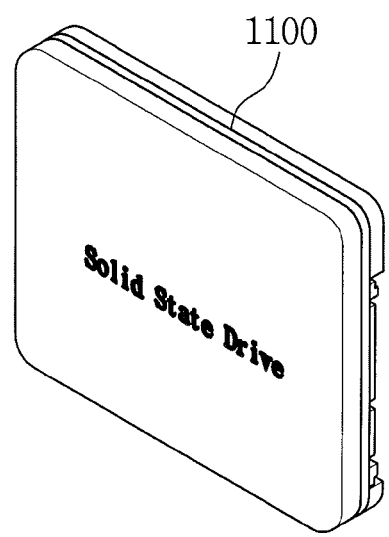
FIG. 42 is a perspective view of an electronic device in accordance with embodiments of the inventive concept.
Figure 43:
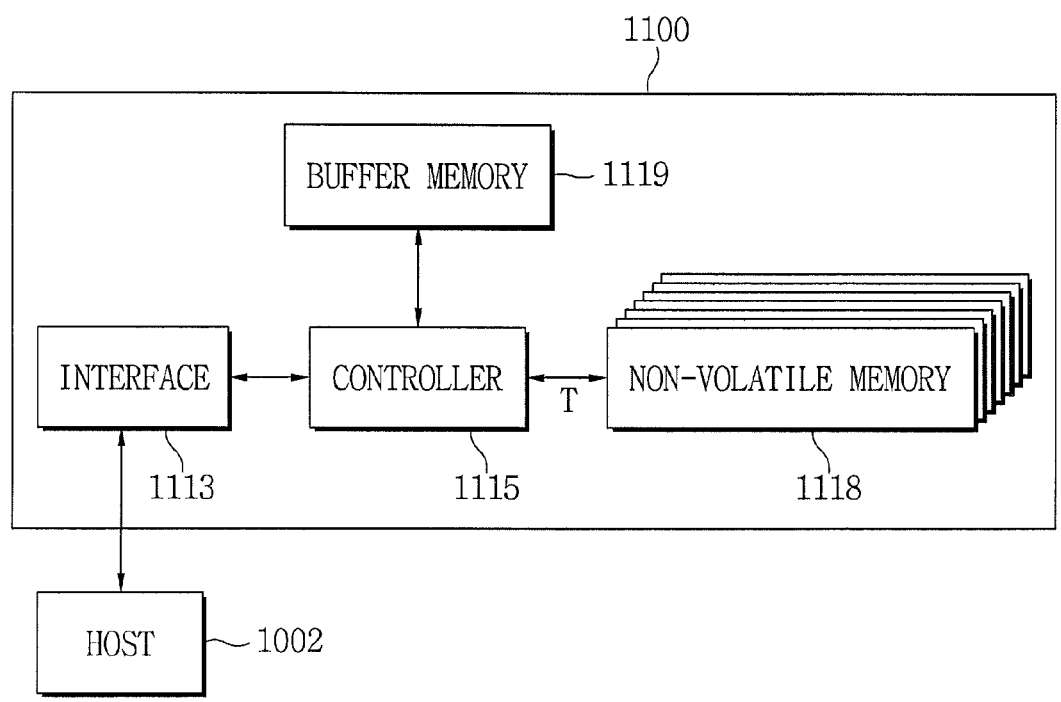
FIG. 43 is a system block diagram of an electronic device in accordance with embodiments of the inventive concept.

FIG. 42 is a perspective view of an electronic device in accordance with embodiments of the inventive concept, and FIG. 43 is a system block diagram of an electronic device in accordance with embodiments of the inventive concept. The electronic device may be a data storage device such as a solid state drive (SSD) 1100.

Referring to FIGS. 42 and 43, the SSD 1100 may include an interface 1113, a controller 1115, a non-volatile memory 1118, and a buffer memory 1119. The SSD 1100 is a device for storing information using a semiconductor device. The SSD 1100 has advantages that it is faster than a hard disk drive (HDD), and mechanical delay, a failure rate, heat and noise, etc. may be less (compared to other types of storage devices), and it may be to made smaller and lighter. The SSD 1100 may be used in a laptop, a notebook PC, a desktop PC, an MP3 player or a portable storage device.

The controller 1115 may be formed adjacent to the interface 1113 and electrically connected thereto. The controller 1115 may be a microprocessor including a memory controller and a buffer controller. The non-volatile memory 1118 may be formed adjacent to the controller 1115 and electrically connected thereto. Data storage capacity of the SSD 1100 may correspond to the non-volatile memory 1118. The buffer memory 1119 may be formed adjacent to the controller 1115 and electrically connected thereto.

The interface 1113 may be connected to a host 1002 to send and receive electrical signals such as data. For example, the interface 1113 may be a device using a standard such as Serial Advanced Technology Attachment (SATA), an integrated drive electronics (IDE), Small Computer System Interface (SCSI), and/or a combination thereof. The non-volatile memory 1118 may be connected to the interface 1113 via the controller 1115. The non-volatile memory 1118 may store data received through the interface 1113. The non-volatile memory 1118 has a characteristic that data stored therein is retained even when power supplied to the SSD 1100 is interrupted.

The buffer memory 1119 may include a volatile memory. The volatile memory may be a dynamic random access memory (DRAM). The buffer memory 1119 may operate at higher speed than the non-volatile memory 1118.

The data processing speed of the interface 1113 may be higher than the operational speed of the non-volatile memory 1118. Here, the buffer memory 1119 may temporarily store data. After the data received through the interface 1113 is temporarily stored in the buffer memory 1119 via the controller 1115, the data may be permanently stored in the non-volatile memory 1118 to match a data write speed of the non-volatile memory 1118. Frequently used data among the data stored in the non-volatile memory 1118 may be temporarily stored in buffer memory 1119 by being read in advance. That is, the buffer memory 1119 may serve to increase a valid operation speed of the SSD 1100 and decrease an error rate thereof.

The buffer memory 1119 may include capacitors formed as described herein in embodiments according to the inventive concept.

Figure 44:
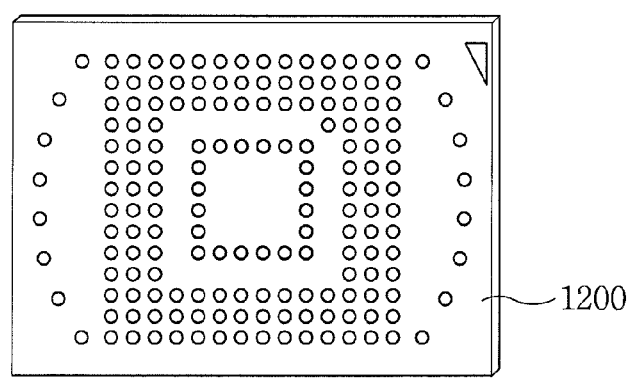
FIGS. 44 and 45 are perspective views of electronic devices in accordance with embodiments of the inventive concept.
Figure 45:
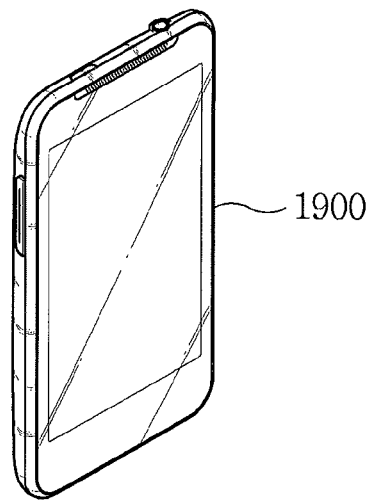
Figure 46:
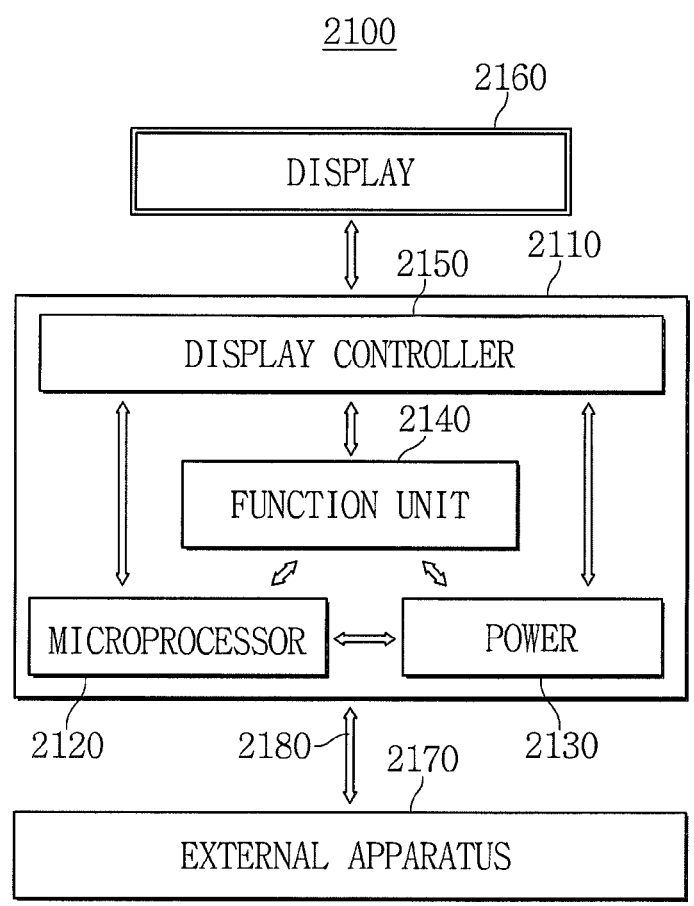
FIG. 46 is a system block diagram of electronic devices in accordance with embodiments of the inventive concept.

FIGS. 44 and 45 are perspective views of electronic devices in accordance with embodiments of the inventive concept, and FIG. 46 is a system block diagram of electronic devices in accordance with embodiments of the inventive concept.

Referring to FIGS. 44 and 45, the semiconductor device described with reference to FIGS. 1 to 40 may be usefully applied to electronic systems such as an embedded multimedia chip (eMMC) 1200, a smart phone 1900, a netbook, a notebook or a tablet PC. For example, a semiconductor device as described with reference to FIGS. 1 to 40 may be mounted on a main board in the smart phone 1900.

Referring to FIG. 46, a semiconductor device as described with reference to FIGS. 1 to 40 may be applied to an electronic system 2100. The electronic system 2100 may include a body 2110, a microprocessor unit 2120, a power unit 2130, a function unit 2140, and a display controller unit 2150. The body 2110 may be a motherboard formed of a printed circuit board (PCB). The microprocessor unit 2120, the power unit 2130, the function unit 2140, and the display controller unit 2150 may be mounted on the body 2110. A display unit 2160 may be disposed inside the body 2110 or outside the body 2110. For example, the display unit 2160 may be disposed on a surface of the body 2110, and display an image processed by the display controller unit 2150.

The power unit 2130 may receive a constant voltage from an external battery, convert the voltage to specified voltage, and supply the specified voltage to the microprocessor unit 2120, the function unit 2140, the display controller unit 2150, and so on. The microprocessor unit 2120 may be supplied with the specified voltage by the power unit 2130, and control the function unit 2140 and the display unit 2160. The function unit 2140 may perform various functions of the electronic system 2100. For example, when the electronic system 2100 is a smart phone, the function unit 2140 may include various components to perform phone functions such as dialing, video output to the display unit 2160 or voice output to a speaker through communication with an external apparatus 2170 and when a camera is also mounted, it may serve as a camera image processor.

In an application embodiment, when the electronic system 2100 is connected to a memory card to expand the capacity, the function unit 2140 may be a memory card controller. The function unit 2140 may send and receive signals to and from the external apparatus 2170 through a wired or wireless communication unit 2180. When the electronic system 2100 includes a Universal Serial Bus (USB) interface to extend the functions, the function unit 2140 may serve as a USB interface controller. The function unit 2140 may include a mass storage device.

A semiconductor device as described with reference to FIGS. 1 to 40 may be applied to the function unit 2140.

According to some embodiments of the inventive concept, an upper molding layer is formed on a lower molding layer having a lower hole. After the upper molding layer is formed, the lower hole is retained in the lower molding layer. A side surface of the lower molding layer may be exposed in the lower hole. An upper hole is formed in communication with the lower hole through the upper molding layer. A contact area of the upper hole and the lower hole can have a gentle slope. A lower electrode, a dielectric layer and an upper electrode can be formed in the upper hole and the lower hole. The lower electrode and the dielectric layer may closely conformally cover sidewalls of the upper hole and the lower hole. The upper hole and the lower hole may constitute a capacitor hole.

Although exemplary embodiments of the invention have been described with reference to the accompanying drawings, it will be understood by those of ordinary skill in the art that various changes in form and details may be made therein without departing from the spirit and scope of the present invention. Therefore, the above-described embodiments should be considered in a descriptive sense only and not for purposes of limitation.

What is claimed:

1. A method of forming a semiconductor device, comprising:
    forming a first molding layer on a substrate at a first deposition rate, wherein the first molding layer has a first molding layer etch rate;
    forming a first hole through the first molding layer;
    forming a second molding layer including a plurality of layers on the first molding layer so that the first hole is retained in the first molding layer, wherein forming the plurality of layers includes forming a lower molding layer directly on the first molding layer at a second deposition rate that is greater than the first deposition rate, and forming an upper molding layer on the lower molding layer, and wherein the lower molding layer has a lower molding layer etch rate that is greater than the first molding layer etch rate and the upper molding layer having an upper molding layer etch rate, wherein the lower molding layer etch rate is greater than the upper molding layer etch rate;
    forming a second hole through the second molding layer to connect with the first hole, wherein a width of the second hole in the lower molding layer and of the first hole in the lower molding layer is greater than a width of the second hole at an interface of the lower molding layer and the upper molding layer; and
    forming a capacitor electrode in the first and second holes.

2. The method of claim 1, wherein forming a second molding layer on the first molding layer further comprises:
    forming the second molding layer so that a side surface of the first molding layer in the first hole is left exposed after formation of the second molding layer.

3. The method of claim 1, wherein a contact angle measured between a sidewall of the first hole and a sidewall of the second hole is an obtuse angle.

4. The method of claim 1, wherein a first portion of a left sidewall of the second hole and a corresponding opposing second portion of a right sidewall of the second hole, opposite the second hole from the first portion, have different profiles.

5. The method of claim 1, wherein forming the second molding layer further includes:
    forming a middle molding layer between the lower molding layer and the upper molding layer, wherein the middle molding layer has a middle molding layer etch rate that is greater than the upper molding layer etch rate.

6. The method of claim 1, wherein forming the second molding layer further includes:
    forming a middle molding layer between the lower molding layer and the upper molding layer, wherein a middle molding layer etch rate is greater than the lower molding layer etch rate.

7. A method of forming a semiconductor device, comprising:
    forming a first molding layer on a substrate, wherein the first molding layer has a first molding layer etch rate;
    etching a first hole through the first molding layer;
    forming a second molding layer directly on the first molding layer so that the first hole is retained in the first molding layer and so that the first hole is capped by a dome shaped surface in the second molding layer extending across an opening at a top of the first hole, and the second molding layer has a second molding layer etch rate that is greater than the first molding layer etch rate;
    etching a second hole through the second molding layer to connect with the first hole;
    forming a lower capacitor electrode in the first and second holes;
    forming a dielectric layer on the lower capacitor electrode; and
    forming an upper capacitor electrode to fill the first hole and the second hole, and to extend outside the second hole to cover an upper portion of the dielectric layer on second molding layer,
    wherein an upper end of the lower capacitor electrode is recessed to beneath an upper end of the second molding layer, the lower capacitor electrode contacts the first molding layer and the second molding layer, the dielectric layer extends outside the second hole to contact and cover the second molding layer.

8. A method of forming a semiconductor device, comprising:
    forming a first molding layer on a substrate using a first deposition rate;
    forming a first hole through the first molding layer;
    forming a second molding layer on the first molding layer using a second deposition rate that is greater than the first deposition rate to form a dome shaped recess in the second molding layer covering the first hole;
    forming a second hole through the second molding layer to connect with the first hole, so that opposing sidewalls of the second hole at a boundary with the first molding layer are recessed outward from the dome shaped recess to provide a lip at the boundary with the first molding layer that protrudes from respective sidewalls of the second hole and extends beyond opposing sidewalls of the first hole; and
    forming a capacitor electrode in the first and second holes, wherein a portion of the capacitor electrode is disposed in the lip.

9. The method of claim 8, wherein forming a second molding layer on the first molding layer further comprises:
    forming the second molding layer so that a side surface of the first molding layer in the first hole is left exposed after formation of the second molding layer.

10. The method of claim 8, wherein the opposing sidewalls of the second hole at the boundary are asymmetrical to one another.

11. The method of claim 8 wherein forming the first molding layer comprises forming a first insulating layer at a deposition rate of about 130 nm/min to about 150 nm/min.

12. The method of claim 11 wherein forming a second molding layer comprises forming a second insulating layer at a deposition rate of about 864 nm/min to about 896 nm/min.

13. The method of claim 12 wherein the second molding layer comprises tetraethyl orthosilicate (TEOS).

14. The method of claim 8, wherein forming a second molding layer comprises forming the second molding layer to a thickness that is about one-half to about 2 times a diameter of the first hole.

15. The method of claim 8, wherein forming a first molding layer comprises forming a first material having a first molding layer etch rate and forming a second molding layer comprises forming a second material having a second molding layer etch rate that is greater than the first molding layer etch rate.

* * * * *